(12) United States Patent
Enthed et al.

(10) Patent No.: US 11,967,030 B2
(45) Date of Patent: Apr. 23, 2024

(54) METHOD, DEVICE AND COMPUTER PROGRAM PRODUCT FOR MANIPULATING VIRTUAL BOUNDING VOLUMES

(71) Applicant: Inter IKEA Systems B.V., LN Delft (NL)

(72) Inventors: Martin Enthed, Steninge (SE); Gustav Olsson, Gothenburg (SE)

(73) Assignee: Inter IKEA Systems B.V., LN Delft (NL)

(*) Notice: Subject to any disclaimer, the term of this patent is extended or adjusted under 35 U.S.C. 154(b) by 0 days.

(21) Appl. No.: 17/732,133

(22) Filed: Apr. 28, 2022

(65) Prior Publication Data

US 2022/0351470 A1 Nov. 3, 2022

(30) Foreign Application Priority Data

Apr. 30, 2021 (EP) .................................... 21171682
Aug. 12, 2021 (EP) .................................... 21191096

(51) Int. Cl.
*G06T 19/00* (2011.01)
*G06T 7/10* (2017.01)
(Continued)

(52) U.S. Cl.
CPC .............. *G06T 19/006* (2013.01); *G06T 7/10* (2017.01); *G06T 15/08* (2013.01); *G06T 15/20* (2013.01); *G06T 19/20* (2013.01); *G06V 20/64* (2022.01); *G06V 20/70* (2022.01); *G06T 2207/20092* (2013.01); *G06T 2219/2004* (2013.01)

(58) Field of Classification Search
None
See application file for complete search history.

(56) References Cited

U.S. PATENT DOCUMENTS

| 5,613,049 A | 3/1997 | Brechner et al. |
|---|---|---|
| 9,734,634 B1 | 8/2017 | Mott et al. |

(Continued)

OTHER PUBLICATIONS

Notification of Transmittal of The International Search Report and The Written Opinion of the International Searching Authority for International Application No. PCT/EP2022/061357 dated Aug. 1, 2022 (14 pages).

(Continued)

*Primary Examiner* — Robert J Craddock
(74) *Attorney, Agent, or Firm* — Merchant & Gould P.C.

(57) ABSTRACT

A computerized method comprising acquiring an image of a physical environment comprising one or more physical entities, generating a virtual view based on the acquired image, and displaying the virtual view overlaid on the acquired image. The method further comprises receiving user input being indicative of a placement location within the virtual view, and receiving user input for creating a virtual bounding volume within the virtual view. The method further comprises manipulating the virtual bounding volume based on one or more intersections in 3D space between the virtual bounding volume and 3D data corresponding to the one or more physical entities, displaying the manipulated virtual bounding volume, and displaying at least one 3D object model that fits the manipulated virtual bounding volume.

14 Claims, 14 Drawing Sheets

(51) Int. Cl.
*G06T 15/08* (2011.01)
*G06T 15/20* (2011.01)
*G06T 19/20* (2011.01)
*G06V 20/64* (2022.01)
*G06V 20/70* (2022.01)

(56) References Cited

U.S. PATENT DOCUMENTS

| | | | |
|---|---|---|---|
| 2014/0184592 A1* | 7/2014 | Belcher | G06F 3/04845 345/420 |
| 2019/0043259 A1 | 2/2019 | Wang et al. | |
| 2020/0226823 A1 | 7/2020 | Stachniak et al. | |
| 2020/0302681 A1 | 9/2020 | Totty et al. | |

OTHER PUBLICATIONS

Extended European Search Report for EP Application No. 21171682.4 dated Oct. 27, 2021 (9 pages).
Extended European Search Report for EP Application No. 21191096.3 dated Apr. 20, 2022 (8 pages).

* cited by examiner

METHOD, DEVICE AND COMPUTER PROGRAM PRODUCT FOR MANIPULATING VIRTUAL BOUNDING VOLUMES

CROSS-REFERENCE TO RELATED APPLICATION(S)

This application claims priority to European Patent Application No. 21171682.4, filed on Apr. 30, 2021, and to European Patent Application No. 21191096.3, filed on Aug. 12, 2021, the disclosures of which are hereby incorporated by reference in their entireties. To the extent appropriate, a claim of priority is made to each of the above-disclosed applications.

TECHNICAL FIELD

The present disclosure generally relates to augmented reality techniques. More specifically, the present disclosure relates to a computerized method for manipulating virtual bounding volumes using augmented reality techniques. The present disclosure also relates to an associated device and computer program product.

BACKGROUND

Techniques related to augmented reality involve enhancing real-world environments with computer-generated information. Augmented reality based programs, systems, methods, apparatuses, devices, etc. therefore combine real and physical worlds to provide an interactive user experience. The virtual aspects of the experience are typically seamlessly interwoven with the physical aspects so that the provided user experience is as immersive as possible.

Augmented reality based programs are frequently used in certain areas of application, such as e-commerce, interior or architectural design, construction, etc., wherein it is desired to visualize how certain virtual objects resembling an actual physical object fit with the physical surroundings. A plurality of different considerations can be taken into account, such as e.g. if the virtual object matches with the physical surroundings with respect to size, design or architectural style, colors, other surroundings of the room, lighting and shadows, and so forth. For instance, it may be of importance to know whether the virtual object fits between e.g. a furniture structure and a wall. Such knowledge can potentially assist a user in selecting and purchasing an appropriate piece of furniture.

In the prior arts there are existing technologies for visualizing virtual objects in the physical world using programs based on augmented reality. However, current existing solutions lack technical provisions related to fitting virtual objects with physical objects, and how to handle interactions therebetween. Current solutions furthermore do not give the user any feedback of what, and how, virtual objects can potentially be fitted in the physical world. Moreover, it is not known how to allow users to, of their own accord and based on the present physical environment, decide upon and manipulate sizes of the virtual objects to be fitted in the physical environment. Additionally, a solution for providing virtual object recommendations with respect to the present physical environment is desired.

In light of the observations above, the present inventors have provided a particularly insightful, efficient, immersive, and easily comprehensible solution that seeks to solve one or more of the above given problems.

SUMMARY

At least some of the embodiments according to the present disclosure eliminate or alleviate at least some of the problems or drawbacks referred to above.

In a first aspect, a computerized method is provided. The computerized method comprises acquiring an image of a physical environment comprising one or more physical entities; generating a virtual view based on the acquired image, the virtual view being a 3D representation of the physical environment and comprising 3D data corresponding to the one or more physical entities of the physical environment; displaying the virtual view overlaid on the acquired image of the physical environment; receiving user input being indicative of a placement location within the virtual view; receiving user input for creating a virtual bounding volume within the virtual view; manipulating, in the virtual view, the virtual bounding volume based on one or more intersections in 3D space between the virtual bounding volume and said 3D data corresponding to the one or more physical entities; displaying, in the virtual view, the manipulated virtual bounding volume, wherein at least a portion thereof is placed at the placement location; and displaying, in the virtual view, at least one 3D object model that fits the manipulated virtual bounding volume.

According to one embodiment, said manipulating the virtual bounding volume comprises at least one of removing at least a portion from the virtual bounding volume, and/or adding at least a portion to the virtual bounding volume.

According to one embodiment, the one or more intersections in 3D space are caused by either one or more from the list of: a drag and drop functionality of the virtual bounding volume, and a resizing functionality of the virtual bounding volume.

According to one embodiment, before or after said manipulating the virtual bounding volume, the method further comprises receiving additional user input for user manipulation of at least a portion of the virtual bounding volume.

According to one embodiment, a model set comprising at least one 3D object model is retrieved from a database unit using the manipulated virtual bounding volume as search input.

According to one embodiment, the manipulated bounding volume is dynamically used as search input in response to being manipulated, wherein at least one currently fitting 3D object model is retrieved from the database unit.

According to one embodiment, the method further comprising determining a recommended 3D object model among the at least one 3D object model in the model set, wherein the step of displaying, in the virtual view, at least one 3D object model that fits the manipulated virtual bounding volume comprises displaying the recommended 3D object model.

According to one embodiment, the method further comprising a step of receiving user input being indicative of whether the model set is to further be based on a type of the physical environment, and/or a physical entity of the one or more physical entities.

According to one embodiment, said generating of the virtual view based on the acquired image comprises identifying said one or more physical entities in the physical environment, and tagging the corresponding 3D data as one of a wall, floor, ceiling, or object, wherein the placement location is associated with a tagged 3D data.

According to one embodiment, the step of manipulating the virtual bounding volume comprises one or more from the list of: removing portions of the virtual bounding volume located within a 3D intersection between the virtual bounding volume and 3D data tagged as an object, removing portions of the virtual bounding volume located within a 3D intersection between the virtual bounding volume and 3D data tagged as a floor, or located vertically below 3D data tagged as a floor, removing portions of the virtual bounding volume located within a 3D intersection between the virtual bounding volume and 3D data tagged as a ceiling, or located vertically above 3D data tagged as a ceiling, and removing portions of the virtual bounding volume located within a 3D intersection between the virtual bounding volume and 3D data tagged as a wall, or located horizontally outside 3D data tagged as a wall.

According to one embodiment, said generating of the virtual view comprises segmenting 3D data tagged as an object into one or more separate objects, and tagging the 3D data correspondingly, wherein the placement location is associated with 3D data tagged as a specific object of the one or more separate objects, wherein the step of manipulating the virtual bounding volume comprises removing portions of the virtual bounding volume located within a 3D intersection between the virtual bounding volume and 3D data tagged as the specific object, or located vertically below 3D data tagged as the specific object.

According to one embodiment, the placement location is associated with 3D data tagged as a floor, wherein the step of manipulating the virtual bounding volume comprises removing portions of the virtual bounding volume located within a 3D intersection between the virtual bounding volume and 3D data tagged as an object, and portions located vertically above 3D data tagged as an object.

According to one embodiment, after the virtual bounding volume is created, the method further comprising a step of receiving user input for changing the 3D data associated with the placement location.

In a second aspect, a mobile computing device is provided. The mobile computing device is configured to acquire an image of a physical environment comprising one or more physical entities; generate a virtual view based on the acquired image, the virtual view being a 3D representation of the physical environment and comprising 3D data corresponding to the one or more physical entities of the physical environment; display the virtual view overlaid on the acquired image of the physical environment; receive user input being indicative of a placement location within the virtual view; receive user input for creating a virtual bounding volume within the virtual view; manipulate, in the virtual view, the virtual bounding volume based on one or more intersections in 3D space between the virtual bounding volume and said 3D data corresponding to the one or more physical entities; display, in the virtual view, the manipulated virtual bounding volume, wherein at least a portion thereof is placed at the placement location; and display, in the virtual view, at least one 3D object model that fits the manipulated virtual bounding volume.

In a third aspect, a computer program product is provided. The computer program product comprises computer code for performing the computerized method according to the first aspect or any of the embodiments being dependent thereon when the computer program code is executed by a processing device.

The provision of a computerized method, device and computer program product as disclosed herein will solve or at least mitigate one or more of the problems or drawbacks identified in the background section of this document. These and other aspects, objectives, features and advantages of the invention and its disclosed embodiments will appear from the following detailed disclosure, from the attached dependent claims as well as from the drawings.

Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

FIG. 2b further illustrates the method step of providing placement location according to the embodiment shown in FIG. 2a.

FIG. 2c further illustrates the method step of providing placement location according to the embodiment shown in FIG. 2a.

FIG. 2d further illustrates the method step of providing placement location according to the embodiment shown in FIG. 2a.

FIG. 8b further illustrates merging of bounding volumes of FIG. 8a.

FIG. 8c further illustrates merging of bounding volumes of FIG. 8a.

FIG. 8d further illustrates merging of bounding volumes of FIG. 8a.

FIG. 9b further illustrates merging of bounding volumes of FIG. 9a.

FIG. 10b further illustrates merging of bounding volumes of FIG. 10a.

FIG. 10c further illustrates merging of bounding volumes of FIG. 10a.

FIG. 11b further illustrates merging of bounding volumes of FIG. 11a.

FIG. 11c further illustrates merging of bounding volumes of FIG. 11a.

FIG. 12b further illustrates merging of bounding volumes of FIG. 12a.

FIG. 12c further illustrates merging of bounding volumes of FIG. 12a.

DETAILED DESCRIPTION

Figure 1:
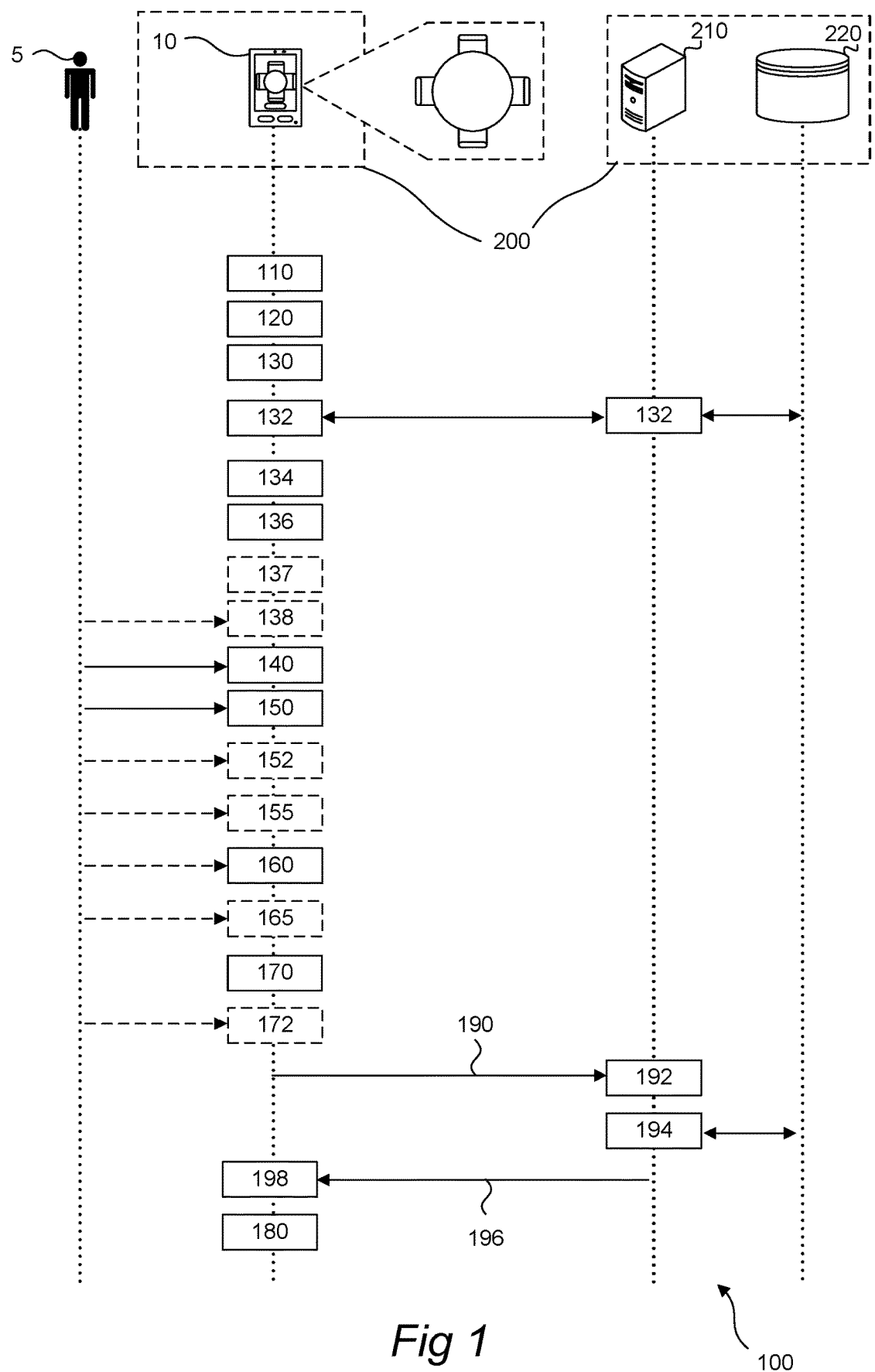
FIG. 1 is a block diagram of a computerized system according to one embodiment.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

With reference to FIG. 1, a flowchart of a computerized method 100 according to one embodiment is shown. The computerized method 100 can, for instance, be implemented by a computer system 200, wherein the computer system 200 is configured for performing the operations of the computerized method 100. The computer system 200 may comprise a mobile computing device 10 being operated by a user 5 thereof, a backend computing unit 210, and a database unit 220. The components of the computer system 200 according to FIG. 1 are mere examples of how the computer system 200 can be implemented, and are by no means to be construed as a limiting example. As depicted in FIG. 1, the mobile computing device 10 may be configured to implement the method steps 110; 120; 130; 132; 134; 136; 137; 138; 140; 150; 152; 155; 160; 165; 170; 172; 190; 198; and 180. Moreover, the backend computing unit 210 may be configured to implement the method steps 132; 192; 194 and 196.

In FIG. 1, the backend computing unit 210 is depicted as a remote service being separate from the mobile computing device 10. The backend computing unit 210 may in this embodiment be a central computing server or a cloud-based service implemented using any techniques known in the art, such as Amazon Web Services, Google Cloud Platform, Microsoft Azure, DigitalOcean, IBM Bluemix or Alibaba Cloud. For embodiments wherein the backend computing unit 210 is provided separately from the mobile computing unit 10, the mobile computing unit 10 comprises means for communication therewith. Such communication means may involve any conventional long-range or short-range communication standards known in the art. As mere examples, communication standards may involve techniques based on W-CDMA/HSPA, GSM, UTRAN, LTE, LTE-A, wireless RF standards based on IEEE 802.11, IEEE 802.15, ZigBee, WirelessHART, WiFi, Bluetooth®, BLE, RFID, WLAN, MQTT IoT, CoAP, DDS, NFC, AMQP, LoRaWAN, RFID, Z-Wave, Sigfox, Thread, or EnOcean.

In other embodiments, the mobile computing unit 10 comprises the backend computing unit 210. Such a backend computing unit 210 is preferably implemented by any commercially available CPU ("Central Processing Unit"), DSP ("Digital Signal Processor") or any other electronic programmable logic device. The backend computing unit 210 is in these embodiments configured to read instructions from a memory and execute these instructions to control the operation of the computer system 200. The memory may be implemented using any commonly known technology for computer-readable memories such as ROM, RAM, SRAM, DRAM, CMOS, FLASH, DDR, EEPROM memory, flash memory, hard drive, optical storage or any combination thereof.

In one embodiment, the database unit 220 is implemented as one or more or a combination of hard-disk drives, solid state drives, USB sticks or memory cards. In another embodiment, the database unit 220 may be maintained by and/or configured as a cloud-based service. Such cloud-based storage means may be deployed as a SQL data model such as MySQL, PostgreSQL or Oracle RDBMS. Alternatively, deployments based on NoSQL data models such as MongoDB, Amazon DynamoDB, Hadoop or Apache Cassandra may be used.

The mobile computing unit 10 may be any type of smart device comprising functionalities capable of running augmented reality based programs, such as a native, web-based or hybrid application. For instance, the mobile computing unit 10 may be a smartphone, tablet computer, smart glasses, head-mounted display, or the like.

The mobile computing unit 10 preferably comprises a camera unit. The camera unit may be arranged in the mobile computing device 10 such that it can acquire still or moving images or (live) video streams of physical surroundings. Alternatively, the camera unit may be a separate camera unit that is independently movable with respect to the mobile computing unit 10. In this embodiment, the camera unit and the mobile computing unit 10 are configured to be able to communicate with each other using e.g. any of the previously mentioned communication standards. Hence, in this embodiment, the mobile computing unit 10 does not necessarily require movement in order to acquire video content.

The mobile computing unit 10 preferably comprises a user interface. The mobile computing unit 10 may be configured to receive input from one or more different input sources through the user interface. The user 5 of the mobile computing device 10 may execute different functions by interacting with or manipulating the computer program via the user interface. The user interface may be any type of human-computer interface known in the art, such as either one or a combination of a graphical user interface, speech-to-text interface, touch interface, textual interface, command line interface, gesture-based interface, or any similar type of interface technology appropriately configured for providing instructions that can be used for executing augmented reality based functions.

In FIG. 1, the computerized method 100 is depicted as having a plurality of different method steps, wherein each step is associated with at least one function. The method steps are not necessarily restricted to occurring one after another in the order as depicted in FIG. 1. Although not explicitly illustrated, some of the method steps may occur in different orders or in parallel.

The computerized method 100 comprises a step of acquiring 110 an image of a physical environment comprising one or more physical entities. The physical environment may alternatively be interpreted as a real-world environment, and the one or more physical entities may correspondingly be interpreted as real-world entities. The physical environment may be any type of physical environment wherein a computerized method 100 according to this disclosure can appropriately be performed. For instance, the physical environment may be a home or office environment, construction environments, recreational environments, environments around or inside vehicles, and so forth. The physical environment is thus not limited to one particular type of real-world environment. Correspondingly, the physical entities may be any type of entity that can be found or in any way belong to the associated physical environment, such as objects, walls, ceiling or floor therein, etc. The embodiment shown in FIG. 1 depicts a round table with four chairs. Hence, in this embodiment, each chair and the table correspond to one physical entity each, and the physical environment may, for instance, be a living room, dining room, kitchen, etc., wherein chairs and tables are commonly found.

Acquiring 110 an image may be performed by capturing still or moving images or video streams of the physical environment and the physical entities. An image may consist of a plurality of image frames, and acquiring 110 said plurality of image frames may be performed continuously (i.e. one or more captures during an arbitrary time period). Although the step of acquiring 110 an image is illustrated as the first step in the method 100, persons skilled in the art realize that it may be performed throughout the entire process. This may be particularly useful if the physical environment changes its appearance throughout the process. In this example, at least one chair can be replaced or removed, additional furniture pieces can be added, the table can be provided with vases or decorative furniture, and so forth.

The mobile computing device 10 may be configured to acquire said image using a camera unit, such as the camera unit that has been previously described. Hence, the user 5 may instruct, through the user interface, the mobile computing device 10 to acquire 110 said image by e.g. manually activating the camera unit. By doing so, the user 5 can decide what image(s) of the physical environment that is to be acquired 110. Alternatively, acquiring 110 an image may be performed by obtaining an image or a video from an online or offline service, wherein a camera is not necessarily required.

The method 100 further comprises a step of generating 120 a virtual view, wherein the virtual view is based on the acquired image. The virtual view can therefore be interpreted as a virtual representation of the physical environment. The virtual view is a three dimensional (3D) representation, meaning that still images or video frames being acquired 110 in two dimensions are translated and represented in 3D as the virtual view. The virtual view therefore comprises 3D data that corresponds to the physical environment and the one or more physical entities being located therein. Means for generating 120 the virtual view are, as such, known in the art, and may comprise using any conventional means appropriate for this purpose. For instance, any 3D capturing technology may be applied, such as LiDAR, stereo camera systems, depth camera systems, structured light projection systems, and so forth.

In one embodiment, generating 120 the virtual view may further comprise a step of identifying the one or more physical entities in the physical environment, and tagging the corresponding 3D data as one of a wall, floor, ceiling or object. Said identification and tagging may in some embodiments be performed in the virtual view generation process, or optionally be performed as a subsequent step. An object may, for instance, be a table, chair, sofa, TV, or any other type of structure within the physical environment. Identifying and tagging the one or more physical entities may involve performing on-the-fly meshing of the environment in at least near real-time. This can be achieved by the user 5 using the camera unit of the mobile computing device 10 to acquire 110 an image of the physical environment, and simultaneously (potentially with some delay) tagging the acquired 3D data of the physical entities. Identifying and tagging the one or more physical entities may, for instance, involve tagging surfaces or polygons thereof, or alternatively each point in a 3D point cloud. The tagged 3D data will consequently be associated with an entity type. Means for identifying and tagging the 3D data of the one or more physical entities may e.g. involve using any known systems or programs that allow access to detailed depth information as gathered by a 3D capture technology (e.g. any of previously mentioned 3D capture technologies). For instance, software APIs such as Apple's ARKit or RealityKit framework may be used for this purpose.

The method 100 further comprises a step of displaying 130 the virtual view overlaid on the acquired image of the physical environment. The virtual view overlaid on the acquired image may, for instance, be displayed on a screen of the mobile computing unit 10.

In one embodiment, displaying 130 the virtual view overlaid on the acquired image consists of two steps, typically performed automatically one after the other. A first step may involve displaying the acquired image of the physical environment. A second step may involve projecting said 3D representation of the physical environment and the corresponding 3D data of the physical entities atop of the acquired image on the screen of the mobile computing unit 10. The virtual view being overlaid on the acquired image is thus to be interpreted as an augmented reality display that presents a combination of virtual content and real content.

In one embodiment, 3D data of any one of the one or more physical entities may be hidden or shown when displaying 130 the virtual view overlaid on the acquired image. For instance, the method 100 may further involve a step of receiving user input for determining what physical entities are to be shown or hidden, respectively, by viewing or hiding specified 3D data of said physical entities. In one embodiment, the physical entities are shown, and the 3D data of the physical entities are hidden by default. Alternatively, a predetermined setting may decide what is to be shown when displaying the virtual view overlaid on the acquired image. The predetermined settings may furthermore specify a transparency level of the 3D data in the virtual view, e.g. by increasing or decreasing the transparency of the 3D data between 0 and 100%. Other transparency schemes may be realized by persons skilled in the art.

In one embodiment, the steps of acquiring 110 an image, generating 120 a virtual view, and displaying 130 the virtual view overlaid on the acquired image are performed directly after one another. As a result, the user 5, e.g. upon capturing a video stream using the mobile client device 10, is, from the user's 5 point of view, directly capable of viewing the displayed virtual view overlaid on the acquired image, preferably with as brief delay as possible.

The method steps 132, 134, 136, 137 and 138 will be described later on in this disclosure, with reference to FIGS. 7-12c.

The method 100 may further comprise steps of receiving 140; 150 user input. The user input may be received by the user 5 in response to having performed one or more selections on the user interface of the mobile client device 10. The steps of receiving user input 140; 150 may be performed simultaneously, or one after the other.

The step of receiving 140 user input comprises receiving user input being indicative of a placement location within the virtual view. The user input corresponding to the placement location may, for instance, be received 140 by the user 5 having clicked, drawn, or in any way selected a location on e.g. the screen of the mobile client device 10. The placement location is virtual in the sense that it is related to a virtual location on the virtual view, but real in the sense that the virtual location corresponds to a physical location, as the virtual view is overlaid on the acquired image. In one embodiment, the placement location is a spatial (3D) coordinate in the virtual view. In another embodiment, the placement location is an area in 3D space of the virtual view. In yet another embodiment, the placement location is a (sub-)volume in 3D space of the virtual view. For instance, the placement location may be any point, area or volume that has been, by the user 5, marked on the floor, at any of the walls, at the ceiling or at any of the object(s) in the virtual view. Hence, the placement location may in one embodiment be associated with a tagged 3D data.

Figure 2A:
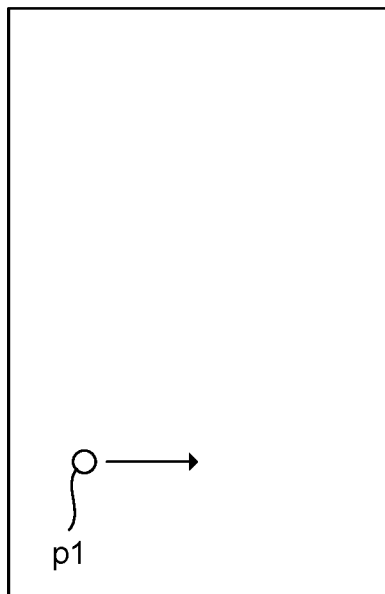
FIG. 2a illustrates a method step of providing placement location according to one embodiment.
Figure 2B:
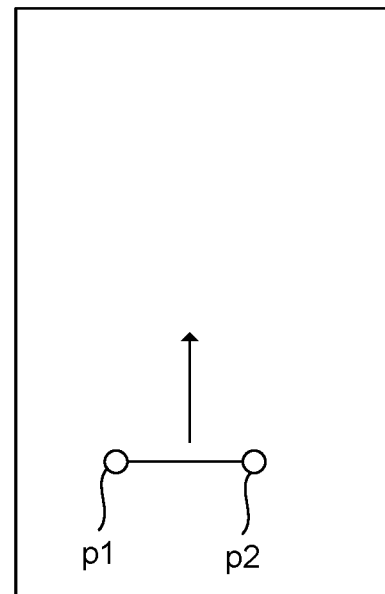
Figure 2C:
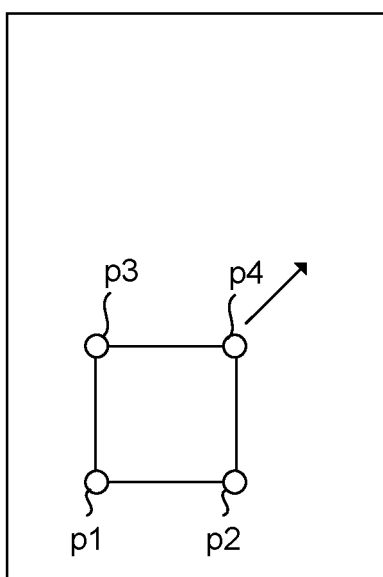
Figure 2D:
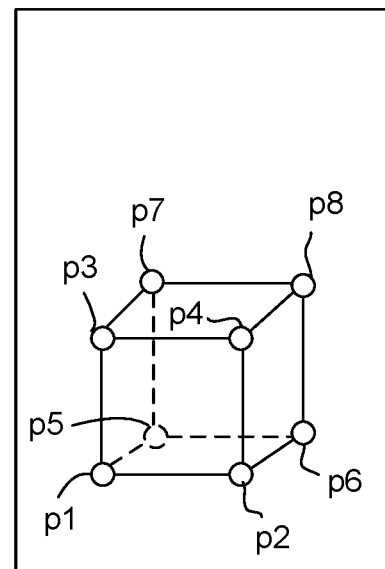

FIGS. 2a-d illustrate, in four different steps, one exemplary embodiment of how the user input for the placement location can be provided. In FIG. 2a, the user 5 has selected an arbitrary first point p1 in the virtual view. In FIG. 2b, the user 5 has dragged and dropped a marker in the virtual view in one direction, thereby creating a second point p2 and a line therebetween. In FIG. 2c, the user 5 has dragged and dropped a marker in the virtual view in another direction, thereby creating a third and fourth point p3, p4, and lines therebetween, together forming an area in the 3D space in the virtual view. Finally, in FIG. 2d, the user 5 has dragged and dropped a marker in yet another direction, thereby creating the four points p5, p6, p7, p8, together with the first four points p1, p2, p3, p4 forming a placement location being a cube. The points p1-p8 and the lines therebetween may be formed at any given location within the virtual view.

After the user 5 has selected a placement location, the method 100 may comprise an additional step of receiving 152 user input for changing the 3D data associated with the placement location. This means that the user 5 may, at any point throughout the process, decide upon a new placement location.

The step of receiving 150 user input comprises receiving user input for creating a virtual bounding volume within the virtual view. As is well known, a bounding volume for a set of objects is the tightest possible closed volume that completely contains the union of the objects in the set. A virtual bounding volume can thus be interpreted as a bounding volume that completely contains the union of one or more virtual objects. The bounding volume may be created as having an arbitrary size or form, as decided by the user input in step 150. For instance, the virtual bounding volume may be formed according to any volumetric 3D form having its edges defined by an arbitrary number of points in 3D space. As a mere exemplary form, the virtual bounding volume may assume any one of an oriented or axis-aligned bounding box, capsule, cylinder, ellipsoid, sphere, slab, triangle, convex or concave hull, eight-direction discrete orientation polytope, or any combination thereof. The volumetric 3D form may therefore be completely arbitrary and not conforming to any type of well-defined known geometric form. Given the example in FIGS. 2a-d, the virtual bounding volume could for instance be created as having a similar form as the placement location being a cube.

The virtual bounding volume may be represented using any known data representation. In one embodiment, a voxel-based data representation may be used. The voxel-based data representation may be advantageous for improving the computational efficiency related to the technical provisions of the present disclosure. As is well known, a voxel is a continuous cuboid region of x, y, and z dimensions contained by a 3D discrete point. A voxel-based data representation may be beneficial for reducing the computational complexity and increasing the filtering speed when performing object searches using virtual bounding volumes as search input. The virtual bounding volume may be generated as having a plurality of voxels with appropriate dimensions. The trade-off between dimensions/sizes of individual voxels and their spatial resolution may vary depending on a variety of factors, such as e.g. hardware capacities, resolution requirements and/or user preferences. Manipulations and object searches using the virtual bounding volume as search input will be discussed in more detail later on in this disclosure. As other alternatives, the virtual bounding volume may be represented using a bounding volume hierarchy representation, polygonal representation, spherically symmetric volume element representation, 3D point cloud representation, implicit surface representation, signed distance field representation or implicit neural representation, to name a few.

The user input defining the virtual bounding volume may, for instance, be received 150 in response to the user 5 having decided upon a specific size or form. A variety of different techniques can be realized for providing the user input for creating the virtual bounding volume, none of which is to be seen as being restrictive on the scope of the present disclosure. For instance, the user 5 may provide the input by drawing a shape in the virtual view, automatically providing a shape based on the placement location, dragging edge points to define a shape, select between models in a list of finished bounding volume models, define end point coordinates and automatically generate a shape between the defined end points, hold a finger on a point in the virtual view and in response thereto generate an increasingly growing bounding volume, and so forth. Moreover, the virtual bounding volume may receive additional input for 6DoF (6 Degrees of Freedom) manipulation, scaling, resizing, stretching, etc., by e.g. interacting with the virtual bounding volume through the user interface.

The method 100 may further comprise a step of manipulating 160, in the virtual view, the virtual bounding volume. The step of manipulating 160 the virtual bounding volume typically entails a plurality of different substeps, and it may be performed in a wide variety of different ways. However, a common denominator for all types of manipulations involves changing the appearance of the virtual bounding volume in the virtual view. Changing the appearance of the virtual bounding volume may, for instance, involve one or more of removing at least a portion thereof or adding at least a portion thereto. As a result, said removing involves the virtual bounding volume shrinking in 3D space, and said adding involves the virtual bounding volume increasing (expanding) in 3D space. These operations may be performed in any direction in the 3D space surrounding the virtual bounding volume.

The step of manipulating 160 the virtual bounding volume as will be described herein may be combined with the step of displaying 170 the manipulated virtual bounding volume in the virtual view. This being said, the user 5 of the mobile computing device 10 may receive direct feedback in response to a manipulation in regards to said manipulation being displayed on the virtual view, at e.g. the screen of the mobile computing unit 10. Alternatively, the step of manipulating 160 the virtual bounding volume may be completed before said volume being displayed in the virtual view, wherein the manipulated virtual bounding volume is displayed. Yet alternatively, the virtual bounding volume may be displayed directly in response to being created. In any one of these alternative embodiments, at least portion of the virtual bounding volume is to be placed at the placement location.

Techniques for displaying 170 the manipulated virtual bounding volume may be based on any known rendering technology. Rendering technologies include, but are not limited to direct volume rendering, isosurface extraction, rasterization, ray casting, ray tracing, ray marching, path tracing, to name a few.

Manipulating 160 the virtual bounding volume is preferably based on one or more intersections in 3D space between the virtual bounding volume and the 3D data corresponding to the one or more physical entities. In other words, whenever at least one portion of the virtual bounding volume intersects with 3D data corresponding to the physical entities in the virtual view, the virtual bounding volume is manipulated. 3D intersections between the virtual bounding volume and 3D data corresponding to the physical entities may alternatively be interpreted as coming into contact with one another, colliding with one another, or in any way interacting with one another. Typically, manipulations are realized in the virtual view as at least a portion of the virtual bounding volume and the 3D data corresponding to the one or more physical objects being at the same location at the same time. Hence, the subject matter related to manipulating 160 the virtual bounding volume enables fitting of the virtual bounding volume with physical objects, which is desired in settings and situations as discussed in the background section of the present disclosure.

Manipulating 160 the virtual bounding volume may involve receiving one or more user inputs, e.g. from the user 5, whereas manipulations of the virtual bounding volume occur in response to receiving said one or more user inputs. Alternatively, the virtual bounding volume may be manipulated in response to e.g. moving a physical entity, such that a new image is acquired and the corresponding 3D data thereof intersects with the virtual bounding volume in the virtual view. Yet alternatively, the virtual bounding volume may be manipulated directly in response to being created. Such a scenario may be realized if the placement location is located at a position in the virtual view such that upon creation of the virtual bounding volume, a portion thereof immediately intersects with 3D data corresponding to a physical entity.

In one embodiment, one or more 3D intersections between the virtual bounding volume and the 3D data corresponding to a physical entity are caused by a drag and drop functionality of the virtual bounding volume. Drag and drop functionalities are, as such, known means in the art. However, for the present disclosure, such a functionality may, for instance, involve three steps: 1) the user 5 is marking the virtual bounding volume to be moved in the virtual view, 2) the user 5 is dragging the virtual bounding volume to a desired location in the virtual view, and 3) the user 5 is dropping the virtual bounding volume at the desired location in the virtual view. As a result, the virtual bounding volume has been moved from one location to another in the virtual view. If, at any point in time during said drag and drop operation, any portion of the virtual bounding volume has intersected with 3D data corresponding to one or more physical entities, the virtual bounding volume is manipulated. An example of a drag and drop functionality will be illustrated and explained thoroughly later on with reference to FIG. 3.

In one embodiment, the one or more 3D intersections between the virtual bounding volume and the 3D data corresponding to a physical entity are caused by a resizing functionality of the virtual bounding volume. Resizing functionalities are, as such, known means in the art. However, for the present disclosure, such a functionality may. for instance, involve three steps: 1) the user 5 is marking the placement location as a point in 3D space in the virtual view, 2) the user 5 is holding one or more fingers on the virtual view, for instance at the placement location, during which the virtual bounding volume continues to grow until the user 5 stops this operation, and 3) the user 5 stops the operation by removing the finger from the virtual view. As a result, the virtual bounding volume has grown from a single point in 3D space to a volume or arbitrary size depending on how long the user 5 has held its finger against the virtual view. A resizing functionality may, in a similar fashion, be realized as the virtual bounding volume being shrunken during the operation. If, at any point in time during said resizing operation, any portion of the virtual bounding volume has intersected with 3D data corresponding to one or more physical entities, the virtual bounding volume is manipulated. Resizing functionalities may alternatively be realized as specifying growth/shrinkage amount in the virtual view, or e.g. dragging a slider between 0 and 100% of a growth/shrinkage amount. Resizing functionalities may be particularly useful in closed spaces within e.g. wardrobes, smaller rooms, corners, etc. wherein the walls in said closed spaces hinders the expansion of the virtual bounding volume. An example of a resizing functionality will be illustrated and explained thoroughly later on with reference to FIG. 4.

In order for the appearance of the virtual bounding volume to be changed, a number of computations or estimations have to be performed. In one embodiment, a backend service of the mobile computing device 10 and/or an active/visible frontend service may be configured to perform these operations. Alternatively, the backend computing unit 210 is configured to perform these operations. As the virtual bounding volume comprises a particular data representation, the operations are directly related to said particular data representation. For instance, if the virtual bounding volume is represented as a voxel-based data representation, changing the appearance by performing the operations may involve e.g. computing or estimating vector data associated with one or more individual voxels together forming the virtual bounding volume. Since such techniques are well known, it will not be given much attention herein.

A 3D intersection between the virtual bounding volume and the 3D data of the one or more physical entities may result in different types of manipulations. The different types of manipulations may depend on how the 3D data is tagged, i.e. if being tagged as a wall, floor, ceiling or object.

In one embodiment, manipulating 160 the virtual bounding volume involves not allowing manipulations through or beyond objects, walls, floor or ceiling of a physical environment. For instance, if the acquired image is representing a closed room, e.g. a living room, the virtual bounding volume is prohibited from changing its appearance (i.e. be manipulated) in locations above the ceiling, below the floor, outside the walls (from a camera viewpoint perspective), or through objects in said living room. Portions of the virtual bounding volume being manipulated into, beyond, or located within such locations are thus removed. This particular embodiment comprises at least four different scenarios, for each one of an object, a wall, a floor and a ceiling. In this embodiment, the x-coordinate or dimension is to be interpreted as the width of the room, the z-coordinate or dimension is to be interpreted as the depth of the room, and the y-coordinate or dimension is to be interpreted as the height of the room. Persons skilled in the art realize that any one of the four scenarios which will now be described can potentially be seen as four different embodiments, none of which are dependent on one another.

In the first scenario, wherein the 3D data is tagged as an object, manipulating 160 the virtual bounding volume involves removing portions of the virtual bounding volume located within a 3D intersection between the virtual bounding volume and 3D data tagged as an object. "Within a 3D intersection" is to be interpreted as at least a portion of the 3D data tagged as an object and the virtual bounding volume being located at the same location in 3D space and at the same time. Thus, in response to a 3D intersection therebetween, the intersecting portions are removed from the virtual bounding volume. In other words, the intersecting portions that are removed from the virtual bounding volume are those portions in 3D space that were occupied both by the 3D data tagged as an object and by the virtual bounding volume, at the same time, prior to manipulation—i.e. overlapping portions in 3D space. The virtual bounding volume may thus be manipulated such that it expands around said 3D data tagged as an object. The virtual bounding volume may e.g. expand around said 3D data tagged as an object in a C-form, an L-form, an upside-down L-form, or a toroidal form (wherein the opening in the center is said 3D data tagged as an object).

In the second scenario, wherein the 3D data is tagged as a floor, manipulating 160 the virtual bounding volume involves removing portions of the virtual bounding volume located within a 3D intersection between the virtual bounding volume and 3D data tagged as a floor. Moreover, any portions located vertically below said 3D data tagged as a floor will be removed. This is to prohibit the virtual bounding volume from being manipulated in locations beneath the floor. Alternatively put, any portion of the virtual bounding volume having its respective y-coordinate lower than the y-coordinate of the intersecting 3D data tagged as a floor is removed. However, expansions of the virtual bounding volume in the x and z-dimensions are not prohibited, even if the virtual bounding volume is interacting with the floor.

In the third scenario, wherein the 3D data is tagged as a ceiling, manipulating 160 the virtual bounding volume involves removing portions of the virtual bounding volume located within a 3D intersection between the virtual bounding volume and 3D data tagged as a ceiling. Moreover, any portions located vertically above said 3D data tagged as a ceiling will be removed. This is to prohibit the virtual bounding volume from being manipulated in locations above the ceiling. Alternatively put, any portion of the virtual bounding volume having its respective y-coordinate higher than the y-coordinate of the intersecting 3D data tagged as a ceiling is removed. However, expansions of the virtual bounding volume in the x and z-dimensions are not prohibited, even if the virtual bounding volume is interacting with the ceiling.

In the fourth scenario, wherein the 3D data is tagged as a wall, manipulating 160 the virtual bounding volume involves removing portions of the virtual bounding volume located within a 3D intersection between the virtual bounding volume and 3D data tagged as a wall. Moreover, any portions located horizontally outside said 3D data tagged as a wall will be removed. "Horizontally outside" is to be interpreted as the side of the wall where the normal points away from the viewpoint of the acquired image, i.e. "outside" the room. This is to prohibit the virtual bounding volume from being manipulated in locations outside of the room. Alternatively put, any portion of the virtual bounding volume being located on a side of the wall plane that points away from the viewpoint is removed. However, expansions of the virtual bounding volume in the y-dimension are not prohibited, even if the virtual bounding volume is interacting with the floor.

In alternative embodiments, the step of manipulating 160 the virtual bounding volume may furthermore be based on the placement location. In these embodiments, the placement location is associated with tagged 3D data of the physical entities. These embodiments are related to certain special cases that may require further restrictions on how the virtual bounding volume is to be manipulated upon intersecting with tagged 3D data of the physical entities. Two different examples of such embodiments will now be described, although persons skilled in the art can potentially think of related examples.

In a first example, said manipulation 160 comprises removing portions of the virtual bounding volume being located vertically above 3D data tagged as an object. This means that, upon the virtual bounding volume being manipulated 160 based on 3D intersections with 3D data tagged as an object, portions can be added in spaces located vertically below said 3D data tagged as an object, whereas portions cannot be added in spaces located vertically above said 3D data tagged as an object. The virtual bounding volume may in this case be generally L-shaped (see e.g. FIGS. 3-4 and left part of FIG. 5).

In a second example, said manipulation 160 comprises removing portions of the virtual bounding volume being located vertically below 3D data tagged as an object. This can be seen as being the opposite case of the first example, i.e. that the manipulation 160 involves that portions cannot be added in spaces located vertically below said 3D data tagged as an object, whereas portions can be added in spaces located vertically above said 3D data tagged as an object. The virtual bounding volume may in this case be generally upside-down L-shaped (see e.g. right part of FIG. 5). This example furthermore involves a step of segmenting 3D data tagged as an object into one or more separate objects, and tagging the 3D data correspondingly, for each of the one or more separate objects. This may be done while generating 120 the virtual view, i.e. together with identifying and tagging each 3D data. In this example, the placement location is associated with 3D data as a specific object among the one or more separate objects. The segmentation thus allows for manipulating 160 the virtual bounding volume differently depending on the number of separate objects. The user 5 may decide, e.g. by providing user input being indicative of a selected object among the one or more separate objects, which object the virtual bounding volume is to be manipulated by. For instance, if there are e.g. three objects stacked atop of each other, the user 5 may choose which specific object among the three objects that the manipulation is to be based upon. Hence, portions of the virtual bounding volume located vertically below 3D data tagged as the selected specific object is removed.

As seen in FIG. 1, the method 100 may further comprise a step of receiving 155; 165 additional user input for further user manipulation of at least a portion of the virtual bounding volume. This step may be performed before or after said manipulating step 160. Further user manipulation of the virtual bounding volume allows the user 5 to further refine a virtual bounding volume to more precisely fit a desired shape. For instance, if the virtual bounding volume has been manipulated 160 using 3D data of physical entities in the view, and the user 5 wants to e.g. remove/add any additional portion of/to the virtual bounding volume, the additional user input allows the user 5 to do so. This may be performed in the user interface using any suitable virtual tool known in the art, such as e.g. virtual draw tools, eraser tools, shave-off tools, and so forth. The combination of steps 160 and 155; 165 enables the user 5 to provide a very accurate virtual bound volume shape to be used as search input for retrieving at least one 3D object model that fits the manipulated virtual bounding volume.

Following FIG. 1, the steps 190, 192, 194, 196 and 198 are all related to 3D object model retrieval using definitions of 3D volumes as search input. In this case, it is the manipulated virtual bounding volume that is being used as search input, and specifically a volume definition thereof. Technologies for retrieving object models in 3D are well known, and the present disclosure is not restricted to one particular type of object model retrieval technology. For instance, if the virtual bounding volume is based on a voxel-data representation, a volumetric representation of a mesh model is defined. Voxelization techniques are then applied, such that the continuous 3D-space containing models being represented as polygonal meshes are transformed into the discrete 3D voxel space. The voxelization then typically proceeds in three stages including discretization, sampling and storing.

Fitting the manipulated virtual bounding volume with at least one 3D model may alternatively be interpreted as resembling in shape. This can be realized in a variety of different ways, none of which are to be construed as limiting to the scope. For example, at least one 3D model may fit the manipulated virtual bounding volume to some extent, the extent being e.g. 90%, 60%, or 40%. In another example, the resemblance may be related to at least one dimension, such as a 95% fit in the x-dimension, a 50% fit in the y-dimension and a 20% fit in the z-dimension. In another example, the resemblance may be related to one particular type of form, e.g. that concave-shaped hulls of the volume preferably return concave-shaped 3D object models. Different resemblance thresholds between the manipulated bounding volume and 3D models may be defined by the user 5 or selected as predetermined settings. Resemblance thresholds may also be self-adjusting depending on e.g. physical environment or entity dimensions, manipulated virtual bounding volume sizes, previous selections, etc. In any one of the above presented examples, the fitting 3D object model preferably takes up as much of the volume within the manipulated virtual bounding volume as possible.

In one embodiment, a filtering may be based on a volume size threshold, wherein a volume size of a 3D object model divided by a volume size of the manipulated virtual bounding volume used as search input exceeds the volume size threshold. For instance, if the volume size threshold is set to 0.8, any 3D object models having volume sizes being less than 80% of the volume size of the manipulated virtual bounding volume used as search input, they will be filtered out.

In any one of the examples provided above, upon more than one fitting 3D model being obtained, the fitting 3D models may be sorted according to one or more resemblance thresholds. To this end, 3D object models having a lower resemblance with respect to the manipulated virtual bounding volume compared to 3D object models having a higher resemblance may be sorted as being of less relevance. For instance, very small object models will typically be considered to have a lower resemblance than larger object volumes with respect to a larger manipulated virtual bounding volume as search input. In one embodiment, the relevance of the fitting 3D models are thus sorted in descending or ascending order with respect to size. In embodiments wherein a voxel-based data representation is used, the fitting 3D object models may be sorted in accordance with the amount of completely filled voxels in the manipulated bounding volume used as the search volume. This may be calculated in a frontend service of the mobile computing device 10, or alternatively in a backend service, such as in the backend computing unit 210, and then received at the mobile computing device 10.

Although the examples above discusses sorting and filtering with respect to volume sizes, persons skilled in the art realize that sorting and/or filtering may alternatively be based upon shape, room features, promotional activities, seasonality, home-décor inspiration, and so forth. Resemblance thresholds for sorting of retrieved 3D object models or for search filters are thus not restricted to volume sizes. In some embodiments, the user 5 may decide one or more resemblance thresholds based on user preferences.

In one embodiment of 3D object model retrieval, the at least one fitting 3D object model is received as metadata. Hence, each fitting 3D object model may be contextualized and catalogued into a respective relevance (e.g. resemblance thresholds as discussed above) concerning the manipulated virtual bounding volume used as search input.

In one embodiment, the method 100 further comprises a step of receiving 172 user input for further specifying how the search is to be performed, e.g. as a search filter. Specifically, said user input involves specifying the contents of the model set based on a plurality of considerations. Such considerations will be described now with reference to three examples. Other similar examples may be realized.

In a first example, the model set may be based on the physical environment in the acquired image. The 3D object models in the model set will thus be related to the associated environment. In this example, if the acquired image depicts e.g. a bedroom, the model set will thus contain object models typically associated with bedrooms, such as e.g. a bed, alarm clock, pillows or bedside chest.

In a second example, the model set may be based on a physical entity among the one or more physical entities. The 3D object models in the model set will thus be related to the associated physical entity. The associated physical entity is typically the physical entity that has previously intersected or being in close proximity of the manipulated virtual bounding volume, although other physical entities in the virtual view may be used. In this example, if the physical entity is a dining table, the model set will thus contain object models typically used together with dining tables, such as e.g. a dining chair, serving tray, tablecloth, or flower vase.

In a third example, the model set may be based on a combination of the first and second examples as described above. Hence, the physical environment and a physical entity among the one or more physical entities may together serve as a basis for the contents of the model set, thereby narrowing the search space additionally.

In embodiments wherein the placement location is associated with a tagged 3D data, the model set may be further based on said placement location. The 3D object models in the model set will thus be related to the placement location being associated with any one of a wall, floor, ceiling or object. It is therefore possible to further filter between 3D object models being related to any one of a wall, floor, ceiling or object depending on where the placement location is located. If the placement location is associated with 3D data tagged as a wall, the model set will contain models that are related to walls, for instance hung on walls or leaned against walls, such as e.g. painting frames, TV hanger, hat rack, mirrors, etc. If the placement location is associated with 3D data tagged as a floor, the model set will contain models that are related to a floor, for instance standing on the floor, such as e.g. a chair, sofa, bed or drawer. If the placement location is associated with 3D data tagged as a ceiling, the model set will contain models that are related to a ceiling, for instance attached to the ceiling or hanging down from the ceiling, such as e.g. a chandelier, ceiling lamp or hanging flowerpot. If the placement location is associated with 3D data tagged as an object, the model set will contain models that are related to objects, for instance commonly used together with or attached to said object, such as e.g. vases standing on a table, monitor standing on a desk or pillows being placed on a bed.

Searches may be performed against a database, such as the database unit 220 which has been previously described. Whenever a search is being performed, a model set comprising at least one 3D object model may be retrieved from the database unit 220. A search may be triggered by the user 5 transmitting a user input through the mobile client device 10 being indicative of a search. The user 5 may thus finish the manipulation steps 160 and 155; 165 of the virtual bounding volume before a search is performed. Alternatively, the manipulated bounding volume may be dynamically used as a search input in response to being manipulated. Hence, at least one currently fitting 3D object model is retrieved from the database unit 220. This does not require the user 5 to manually perform searches, as 3D object models currently fitting the manipulated virtual bounding volume will continuously be retrieved.

Upon having retrieved at least one 3D object model that fits the manipulated virtual bounding volume, the method 100 comprises a step of displaying 180, in the virtual view, said at least one 3D object model. The user 5 is thus allowed to directly view the 3D object model within the manipulated virtual bounding volume. In different embodiments of the invention, the user 5 is allowed to view the at least one 3D object model using a variety of different techniques.

In one embodiment, displaying 180 the 3D object model may also trigger the virtual bounding volume to be hidden, so that the user 5 only can see the 3D object model. Alternatively, the user 5 can provide additional user input for deciding the transparency of the virtual bounding volume. Alternatively, the virtual bounding volume will have an alternating transparency depending on how far away from the actual physical entity the user 5 is, or how far the user 5 has zoomed into the virtual view. Alternatively, the transparency of the virtual bounding volume may increase or decrease if the user 5 clicks on a location in the virtual view, e.g. on the 3D object model. Yet alternatively, the virtual view may include a slider that can be dragged in either direction to increase or decrease the transparency of the virtual bounding volume between 0 to 100%. Other transparency schemes may be realized by persons skilled in the art.

In embodiments wherein the model set is retrieved, the method 100 may further comprise a step of determining a recommended 3D object model among the at least one 3D object model in the model set. The step of displaying 180 said at least one 3D object model may thus involve displaying the recommended 3D object model. The recommended 3D object model may be based on either one or a combination of features, such as an appropriate model type in regards to the physical environment, the physical entities, tagged 3D data, the placement location, a fit ratio, a reported total volume, a computed voxelized volume and/or a computed polygonal volume, etc., being associated with the manipulated virtual bounding volume. A scoring scheme may be applied for this purpose, wherein the 3D object model having the highest score is recommended and thereby displayed. For instance, if any of the features just mentioned are true for a certain 3D object model, a score can be added and accumulated for said certain 3D object model. The score can then be compared with other 3D object models in the model set. Hence, the 3D object model having the highest score is selected as the recommended 3D object model. Scoring schemes and recommendation algorithms are, as such, known in the prior art. Any conventional means, such as collaborative filtering, content-based filtering, multi-criteria recommender systems, mobile recommender systems, or any combination thereof, may thus be used for determining a recommended 3D object model.

The user 5 may be given different viewing options of the 3D object model in the virtual view. In one embodiment, the displayed 3D object model and/or virtual bounding volume may be provided with a marker in the virtual view. The marker can, for instance, allow the user 5 to hover, change or scroll between the 3D object models in the model set, i.e. search results. Additionally, or alternatively, the marker can allow the user 5 to adjust the location of the 3D object model in the virtual view by e.g. moving it along a plane in 3D space.

With reference to FIGS. 3, 4, 5 and 6, four exemplary embodiments of a computerized method 100 according to the present disclosure are illustrated. All of the embodiments which will now be described illustrate a physical entity being represented as a table, and a virtual bounding volume. The illustrated hand is to be interpreted as the user's 5 hand or a pointer device (e.g. virtual 2D tool used to interact with the virtual view) that is currently manipulating the virtual bounding volume through a virtual view. For any one of the exemplary embodiments, as well as in any further embodiment realized by persons skilled in the art, the user 5 may, at any point throughout the manipulation process, decide upon a new placement location. To this end, the user 5 may provide input that specifies a new placement location within the virtual view, even after the virtual bounding volume has been created and/or manipulated. For instance, the user 5 may move the placement location from the floor to the table, or vice versa.

Figure 3:
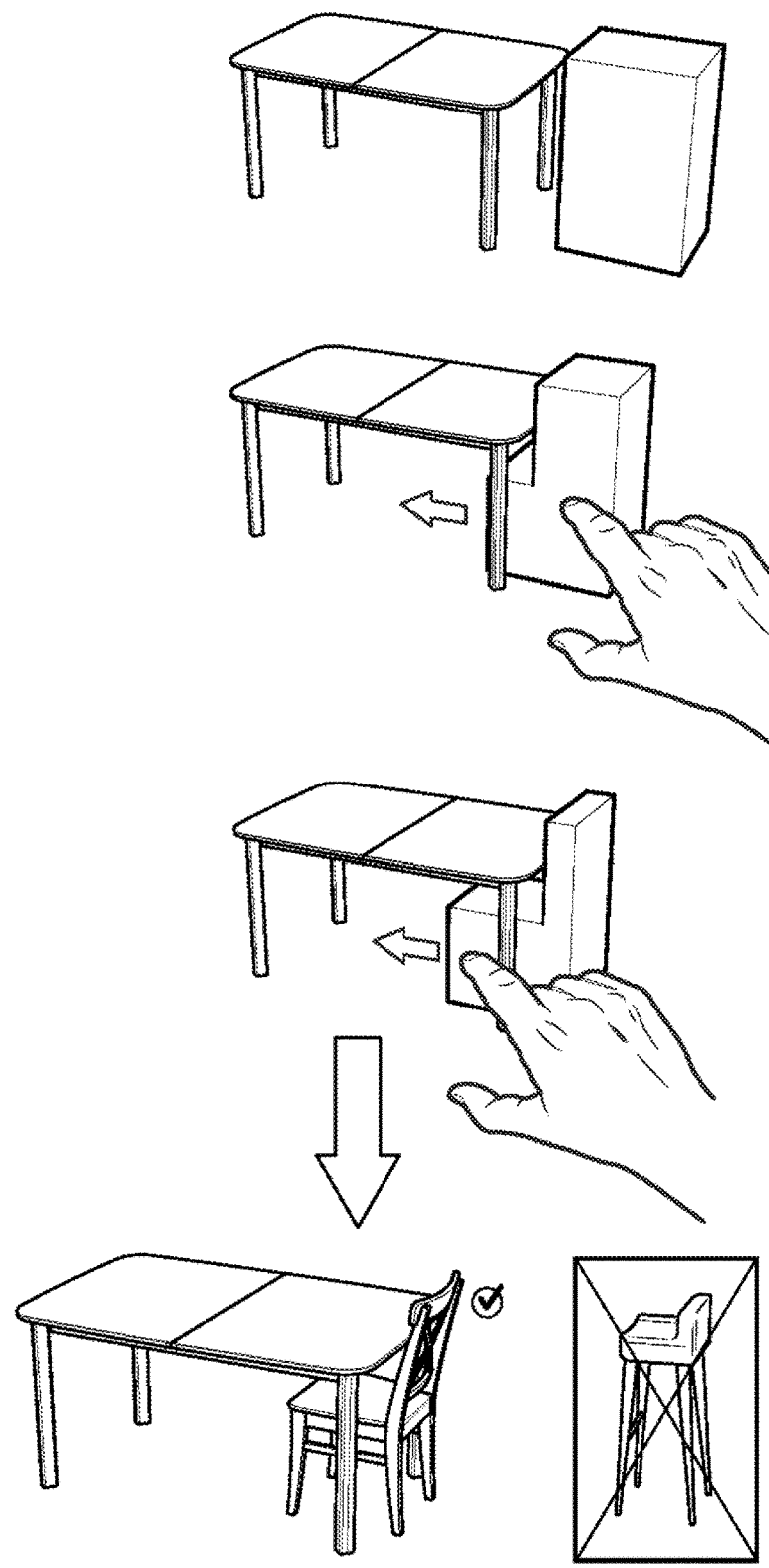
FIG. 3 illustrates a method step of manipulating a virtual bounding volume according to one embodiment.

FIG. 3 is an example of manipulating 160 the virtual bounding volume using a drag and drop functionality. In FIG. 3, the virtual bounding volume has been created and placed at a placement location adjacent to the table, and the user 5 is dragging the virtual bounding volume towards the table. As a result, it can be seen that a portion of the virtual bounding volume is intersecting with a portion of the table. Hence, the intersecting portions are being removed from the virtual bounding volume. Moreover, any portions located vertically above the table have been removed since the placement location is associated with the floor (as has been described in accordance with some embodiments in this disclosure). Upon the user 5 dragging the virtual bounding volume further towards the table, additional portions of the virtual bounding volume are thereby removed. A 3D object model search is then to be performed. Hence, a fitting 3D object model is found and replaces the manipulated virtual bounding volume, while other non-fitting 3D object models (e.g. the higher chair) have been filtered out.

Figure 4:
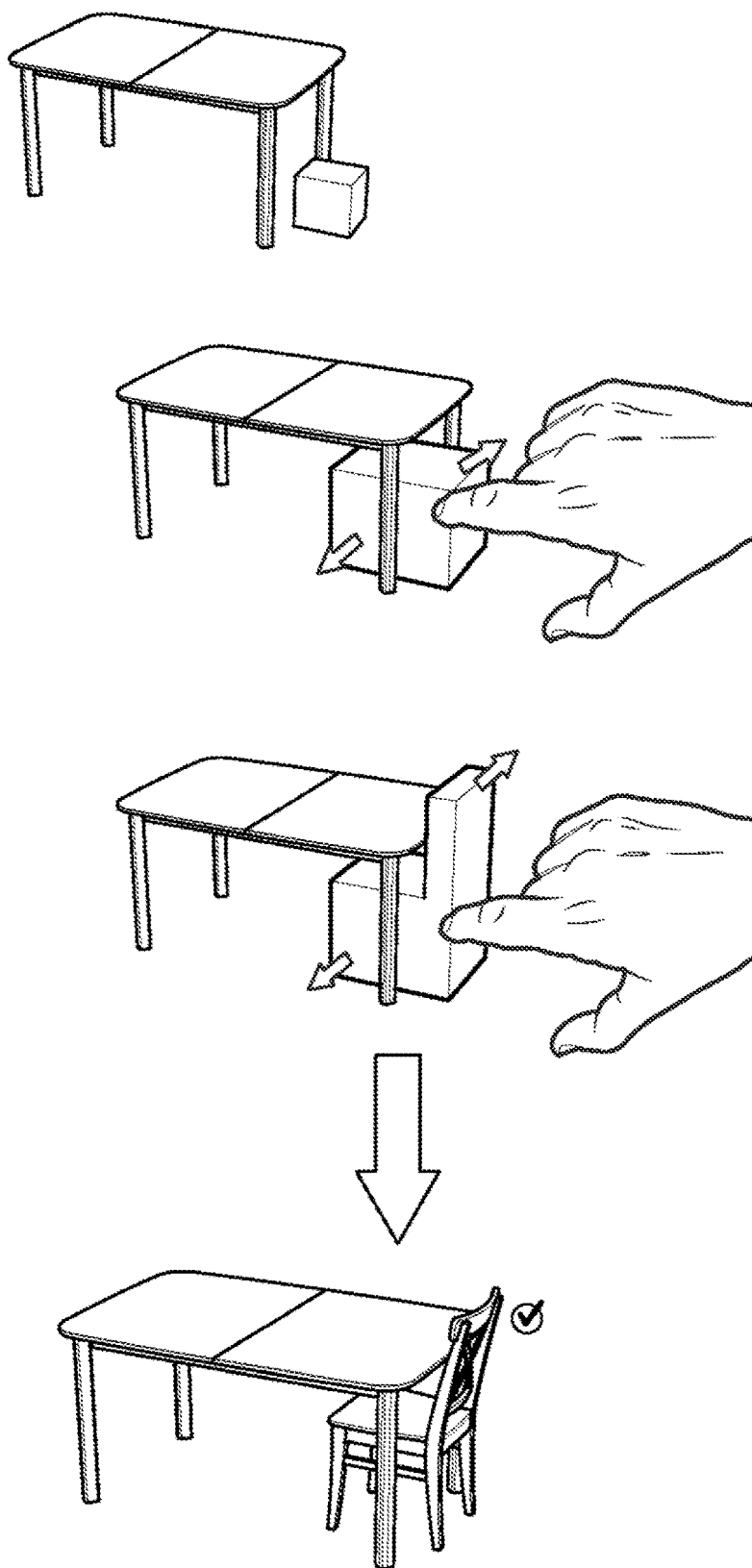
FIG. 4 illustrates a method step of manipulating a virtual bounding volume according to one embodiment.

FIG. 4 is an example of manipulating 160 the virtual bounding volume using a resizing functionality. The virtual bounding volume has been created and placed at a placement location adjacent to the table. The user 5 is then holding a finger atop of the virtual bounding volume at the virtual view. Hence, the size of the virtual bounding volume is increasing. Upon the user 5 having held its finger atop of the virtual bounding volume until it has intersected with the table, intersecting portions of the virtual bounding volume are thereby removed since the placement location is associated with the floor (as has been described in accordance with some embodiments in this disclosure). Moreover, portions of the virtual bounding volume located vertically above the table are removed. It can be seen that the virtual bounding volume is expanding according to an L-shaped form with respect to the table. A 3D object model search is then to be performed. Hence, a fitting 3D object model is found and replaces the manipulated virtual bounding volume.

Figure 5:
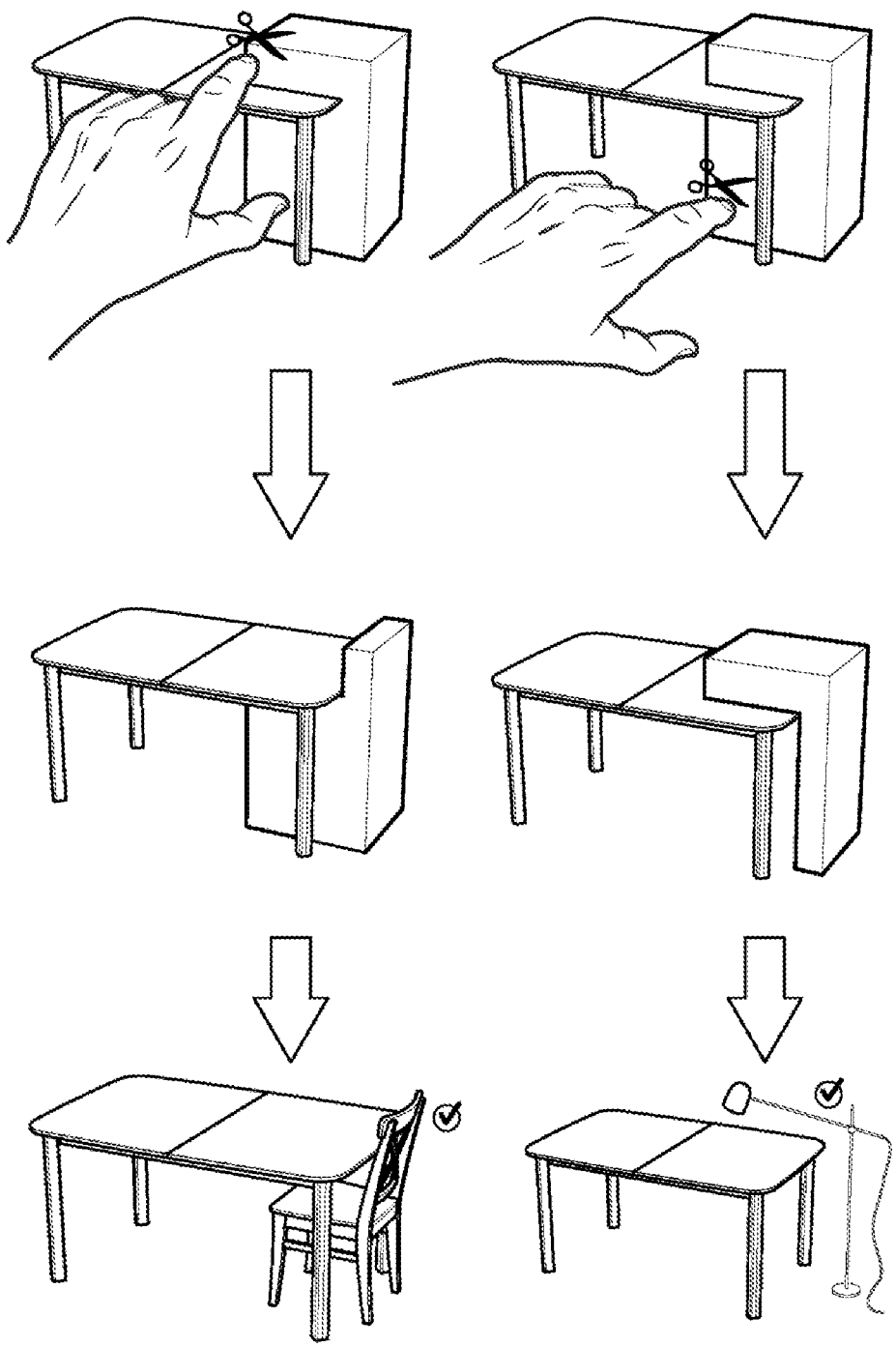
FIG. 5 illustrates a method step of manipulating a virtual bounding volume according to one embodiment.

FIG. 5 is an example of manipulating 160 the virtual bounding volume. The virtual bounding volume has been created and placed at a placement location that is currently intersecting with the table in 3D space. In this example, before the virtual bounding volume is manipulated by the table, the user 5 is allowed to decide whether portions of the virtual bounding volume are to be removed vertically above or vertically beneath the table, which is depicted as the scissors icon. The decision is directly related to the placement location in the sense that the portions of the virtual bounding volume are to be removed depending on the selected placement location (as has been described in accordance with some embodiments in this disclosure). The manipulated virtual bounding volume is then shown to assume one of two different shapes, e.g. an L-shape (to the left), or an upside down L-shape (to the right). When the user 5 performs an object search using the manipulated virtual bounding volume as input, the search result will thus be different depending on which of the two shapes are provided as search input. As seen in the figure, the L-shaped volume retrieves a chair as the fitting 3D object model, whereas the upside down L-shaped volume retrieves a lamp as the fitting 3D object model.

Figure 6:
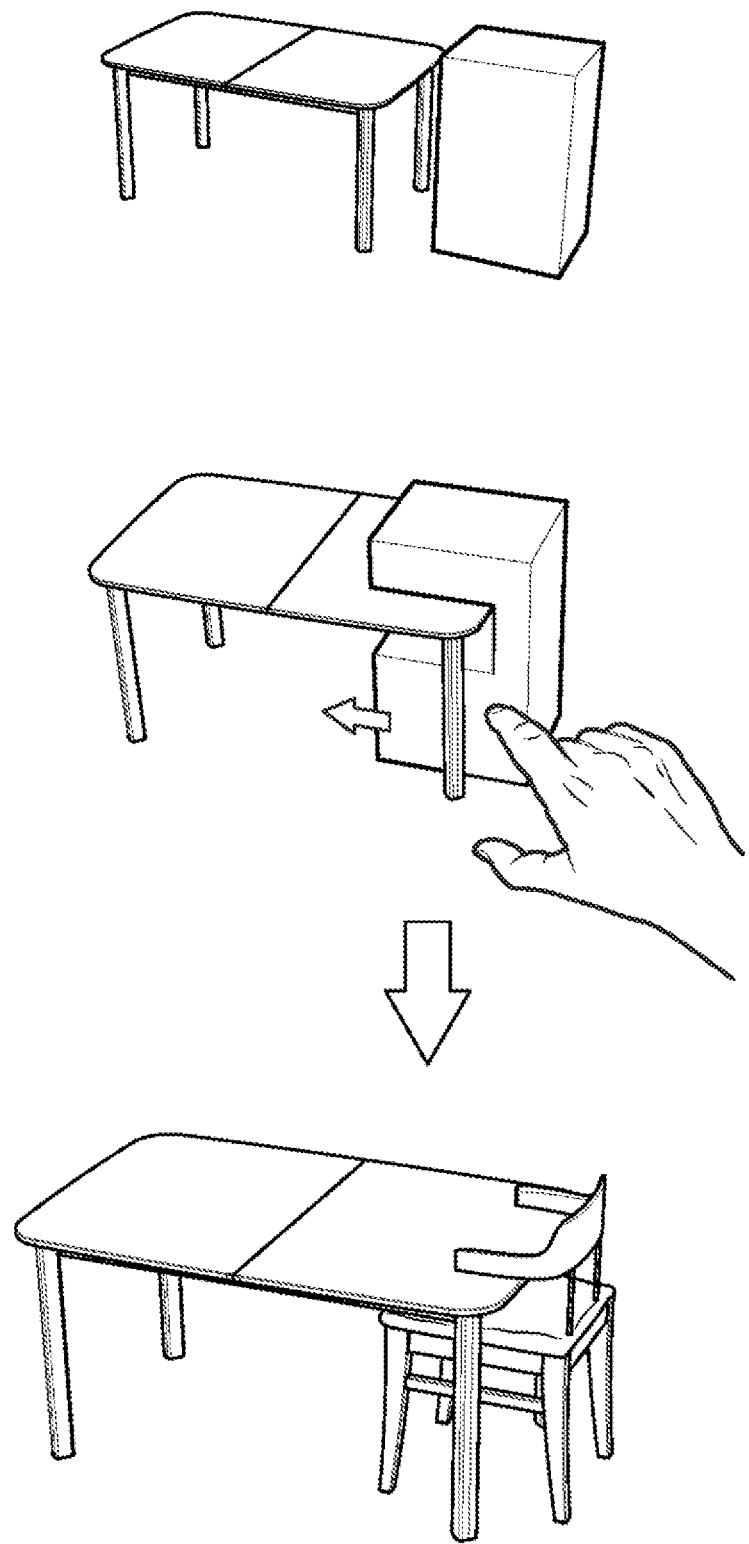
FIG. 6 illustrates a method step of manipulating a virtual bounding volume according to one embodiment.

FIG. 6 is an example of manipulating 160 the virtual bounding volume using a drag and drop functionality. The virtual bounding volume has been created and placed at a placement location adjacent to the table. When user 5 has dragged the virtual bounding volume towards the table, portions of the virtual bounding volume are intersecting with a portions of the table. Hence, the intersecting portions are being removed from the virtual bounding volume. In this example, as opposed to the example presented in FIG. 3, any portions located vertically above the table are not removed. The virtual bounding volume is thus assuming a C-shaped form with respect to the table. If the user 5 were to increase the size of the virtual bounding volume additionally, there is a possibility that the entire table would be surrounded by the volume. The virtual bounding volume would thus assume a toroidal shape. When the user 5 has decided that a 3D object model search is to be performed, a fitting 3D object model is found and replaces the manipulated virtual bounding volume. In this case, the fitting 3D object model is a chair with armrests extending vertically above the table.

In one embodiment, the different manipulation functionalities, e.g. drag and drop or resizing, may provide the user 5 with additional manipulation options. Manipulation options may involve deciding how the virtual bounding volume is to be manipulated in response to being intersected in 3D space by the one or more physical entities. For instance, the user 5 may decide whether the manipulation should behave in accordance with FIG. 3, FIG. 5 (rightmost image) or FIG. 6. To clarify, the user 5 may decide if portions of the virtual bounding volume only should be removed within 3D intersections, or additionally be removed at locations vertically above or below said one or more physical entities. As a predetermined setting, however, the virtual bounding volume is typically being manipulated in accordance with FIG. 6.

Figure 7:
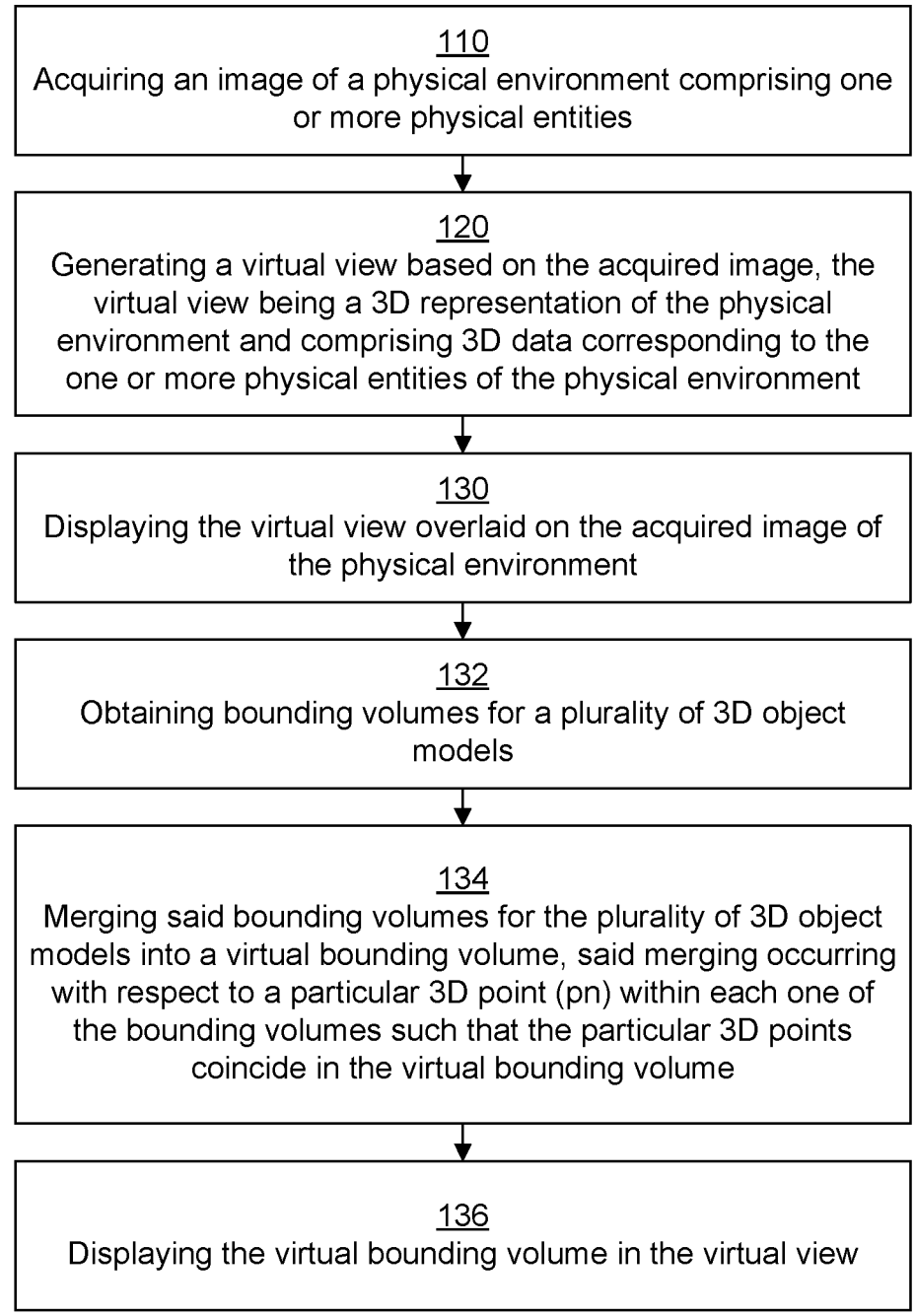
FIG. 7 is a block diagram of a computerized method according to one embodiment.

FIG. 7 illustrates a computerized method 100. The steps 110; 120; 130 are to be performed generally according to the present disclosure as disclosed above in conjunction with FIGS. 1 to 6. The steps 132, 134 and 136 which will be described from here on, on the other hand, are related to alternative ways of creating the virtual bounding volume compared to what has been previously described in conjunction with FIGS. 1 to 6. One of the main purposes of the steps 132, 134 and 136 is to create a virtual bounding volume that is based on a search. Hence, compared to subject matter which has been previously described, the search is in the following embodiments performed prior to any manipulation of the virtual bounding volume. This is to provide users with visual indications of appearances of which one and how many of the 3D object models that currently fit the virtual bounding volume. The method step 132 involves obtaining bounding volumes for a plurality of 3D object models. The method step 134 involves merging said bounding volumes for the plurality of 3D object models into a virtual bounding volume. The merging occurs with respect to a particular 3D point pn within each one of the bounding volumes such that the particular 3D points coincide in the virtual bounding volume. The method step 136 involves displaying the virtual bounding volume in the virtual view. The computerized method 100 may be implemented by a mobile computing device, such as the mobile computing device 10 presented herein.

A computer program product comprising computer code for performing the computerized method 100 according to FIG. 7 when the computer program code is executed by a processing device may be provided. The processing device may, for instance, be a CPU in the mobile computing unit 10 or any external CPU or other programmable logic device capable of performing the disclosed method steps 110; 120; 130; 132; 134; 136.

In FIGS. 8a-12c, different embodiments of the method steps 132, 134, 136, 137 and 138 are shown. These embodiments present alternative ways of creating the virtual bounding volume according to the present disclosure.

Figure 8A:
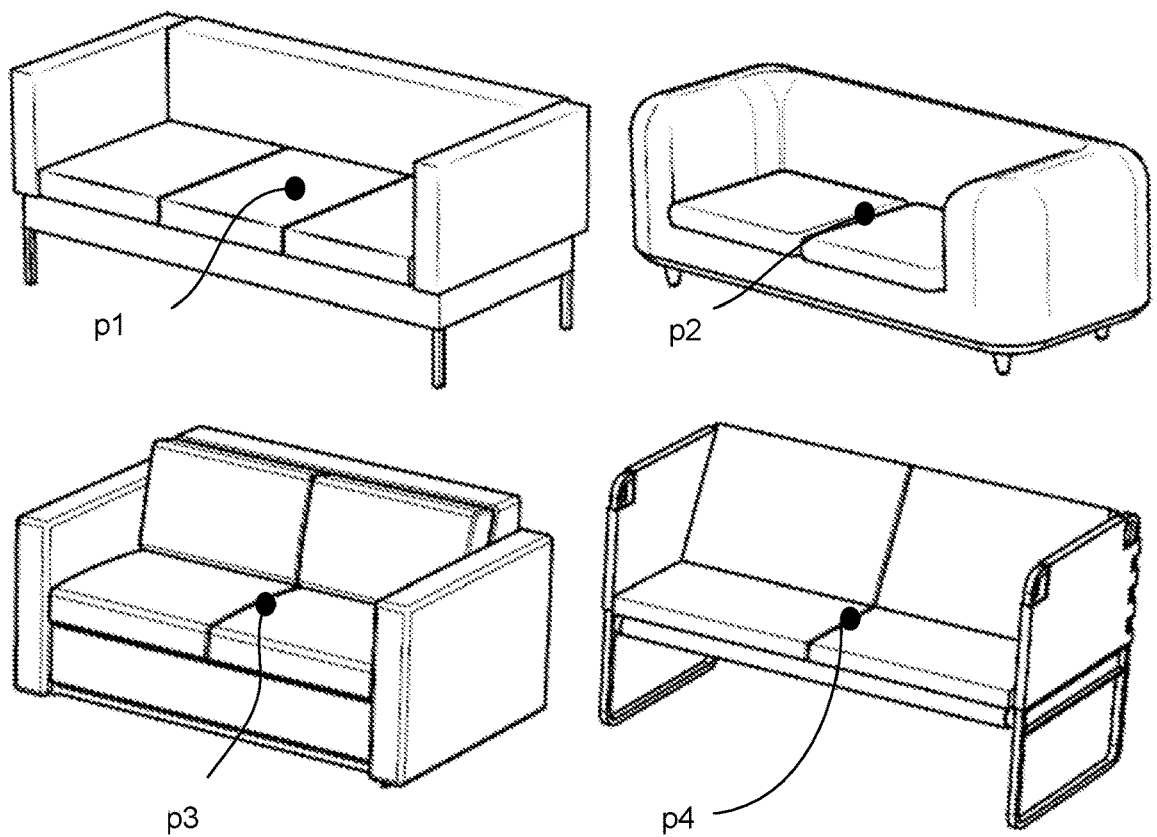
FIG. 8a illustrates an embodiment of merging of bounding volumes.

With reference to FIGS. 8a-d, an exemplary embodiment of creating the virtual bounding volume is shown. In this embodiment, the method 100 involves a step of obtaining 132 bounding volumes for a plurality of 3D object models. As is seen in FIG. 8a, the 3D object models represent four different models of sofas. The user of the mobile computing device 10 is allowed to choose (e.g., by filtering or searching among an available product range at an e-commerce site or in a planning tool for home furnishing, etc.) what type of 3D object models that are to serve as a base for creating the virtual bounding volume. This advantageously provides the user with instantaneous feedback related to appearances for all of the obtained 3D object models and how they may fit in the physical environment. Compared to manually drawing the initial bounding volume and selecting the placement location, for instance as exemplified in FIGS. 2a-d and previously described, this embodiment gives the user a better insight as to what volume the products that the user is interested in will occupy in the physical environment. A more convenient further filtering process may thus be facilitated considering that the obtained 3D models may be visualized while there still may be many different potential fitting products. Such further filtering process may, for instance, be any one of the embodiments described in accordance with FIGS. 3-6 or using any other means of filtering such as manually deselecting objects to remove them from the list and thus reduce the size of the virtual bounding volume.

The obtaining 132 may further involve retrieving the 3D object models from a database unit 220 based on object model filtering input. The object model filtering input can generally be interpreted as any type of possible filtering options, or any combination of filtering options, for providing a plurality of different 3D object models.

In one embodiment, the object model filtering input is a product type. For instance, the product type may be a particular piece of item, such as a sofa, a lamp, a desk, a vase, a bed, a sideboard, and so forth. In one embodiment, the object model filtering input is a product category. The product category may, for instance, be a particular series of items related to a category, such as outdoor or garden furniture, shelving units, generally having a broader scope than the product type. In one embodiment, the object model filtering input is a product appearance. The product appearance may, for instance, be related to particular colors, shapes, dimensions, textures, materials, and so forth. In one embodiment, the object model filtering input is a product collection. The product collection may, for instance, be old collections, current collections, upcoming collections, wherein a collection can comprise different products in different categories, e.g. sofas, lamps, tables, and chairs. As an example of a combination of these object model filtering inputs, a user may retrieve 3D object models of dark leather-based sofas having a dimension of at most 3×2×1.5 m and being a part of the latest winter collection currently being on sale. Any such additional combination of object model filtering inputs may be realized.

Figure 8B:
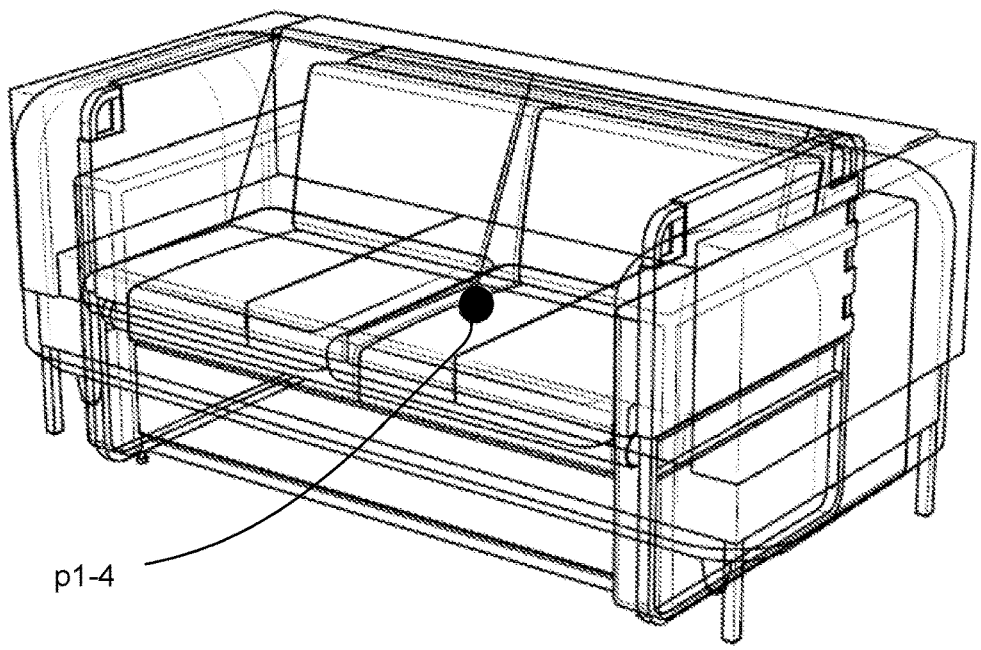

In FIG. 8b, an embodiment of merging 134 the bounding volumes for the plurality of obtained 3D object models into a virtual bounding volume is shown. In this example, four object models representing sofas have been merged, but any number from two up to an arbitrary number of object models can serve as a base for creating the virtual bounding volume. The more object models that are included in the merged virtual bounding volume, the more computationally complex the filtering will be. However, by including more object models, the feedback that is given to the user regarding e.g., occupied space in the home will be improved. Having e.g. a voxel-based data representation of the virtual bounding volume can provide satisfactory results in both these regards. The virtual bounding volume representing the merged bounding volume may therefore encompass all of the bounding volumes as obtained during the obtaining of 3D object models.

The merging 134 is occurring with respect to a particular 3D point pn (also referred to herein as a merging point) in each one of the bounding volumes of the obtained 3D object models. The "n" in the particular 3D points pn may be an integer value from 1 to $n_{max}$, wherein $n_{max}$ is the number of obtained bounding volumes. Accordingly, for each one of the bounding volumes, a particular 3D point p1, p2, p3, p4 will coincide at point p1-4 in the merged virtual bounding volume. Alternatively put, upon a completed merge, the bounding volumes are located generally at the same location in 3D space, such that the bounding volumes are overlaid, or superimposed, atop of each other.

In some embodiments, the merging points pn depend on the intended placement of an obtained 3D object. The intended placement may be received as metadata on the obtained 3D object models. The selected merging points pn may be automatically determined using an algorithm, or based on user input.

For example, if the obtained 3D objects are all intended to be placed on a horizontal surface, the points pn are selected such that the bounding volumes are merged such that the lower edge of each bounding volume coincide, for example by choosing a bottom center point of each bounding volume as the merging point of each one of the bounding volumes of the obtained 3D object models. This is the case in the example of FIG. 8b.

If the obtained 3D objects are all intended to be hanged from a horizontal surface, the points pn are selected such that the bounding volumes are merged such that the upper edge of each bounding volume coincide, for example by choosing a top center point of each bounding volume as the merging point of each one of the bounding volumes of the obtained 3D object models.

If the obtained 3D objects are all intended to be hanged on a vertical surface, the points pn are selected such that the bounding volumes are merged such that the vertical edge on the "backside" (side intended to face the vertical surface) of each bounding volume coincide, for example by choosing a back center point of each bounding volume as the merging point of each one of the bounding volumes of the obtained 3D object models.

If the intended placement of the obtained 3D object models differs, the majority rule may be applied to decide the merging point of each one of the bounding volumes of the obtained 3D object models, or a predefined particular 3D point may be selected, or the user may have to indicate the merging point from a list of possible choices, or an error message may be shown such that the user have to remove some objects from the obtained 3D object models before the bounding volumes are merged.

Subsequent to the merging 134, the method 100 further comprises a step of displaying 136 the virtual bounding volume in the virtual view. The displaying 136 therefore gives the user a compact indication of the "superimposed" volume (virtual bounding volume) occupied by the 3D object models. This may be performed generally according to the displaying step 170 as described above.

Considering FIGS. 8a-b and the description associated therewith, these embodiments present an alternative way of selecting the placement location than what was disclosed with reference to FIGS. 2a-d. Since the plurality of 3D models for the bounding volumes will constitute what is to serve as a base for creating the virtual bounding volume, the placement location can in these embodiments be considered to represent the location covered by the space of the obtained bounding volumes, or alternatively the space of the virtual bounding volume.

For the embodiments presented with reference to FIGS. 8a-12c, a variety of different techniques may be utilized for selecting the placement location. Some examples will be provided herein, but these are not to be interpreted as limiting to the scope of the present disclosure.

In one embodiment, the placement location may be automatically selected upon having obtained the bounding volumes for the 3D object models, or alternatively merged them into the virtual bounding volume. The automatic selection may, for instance, occur at an arbitrary distance (e.g. 0.5 m, 1.0 m, 10 m, or generally any distance) and in an arbitrary angle (e.g. 10°, 30°, 50°, or generally any angle) from the camera unit of the mobile computing device 10. Alternatively, the placement location may be automatically selected based on what type of product that has been obtained. For instance, if plural bounding volumes for 3D models representing wall products, such as a wall painting or mirror, have been obtained, the placement location may be automatically selected as a location on the wall currently being closest to the camera unit of the mobile computing device 10. The currently closest wall may be calculated in accordance with scanning and tagging surfaces of the physical environment using e.g. the ARKit/RealityKit frameworks as previously discussed. The same procedure may be realized for floor products, ceiling products, or products that can be placed on other products.

In one embodiment, the placement location may be determined by a user manually clicking at an arbitrary location in the virtual view. The arbitrary location may, for instance, be a location at the floor, at a wall, at another object, at the ceiling, and so forth. Alternatively, the placement location has been predetermined by the user, prior to having obtained the bounding volumes of the plurality of 3D models.

In one embodiment, the placement location may be determined based on previously placed bounding volumes. For instance, if one of more bounding volumes has, at some point earlier in time, been positioned at a placement location somewhere in the virtual view, any upcoming obtained bounding volumes may per default be placed at a similar placement location.

Figure 8C:
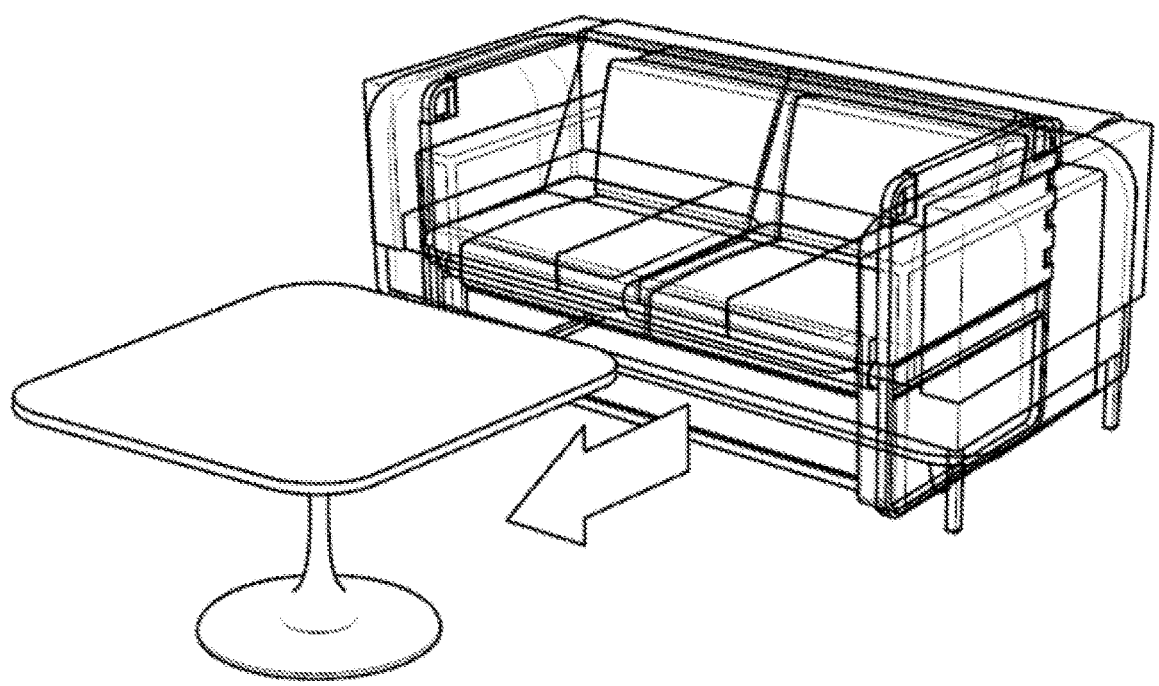
Figure 8D:
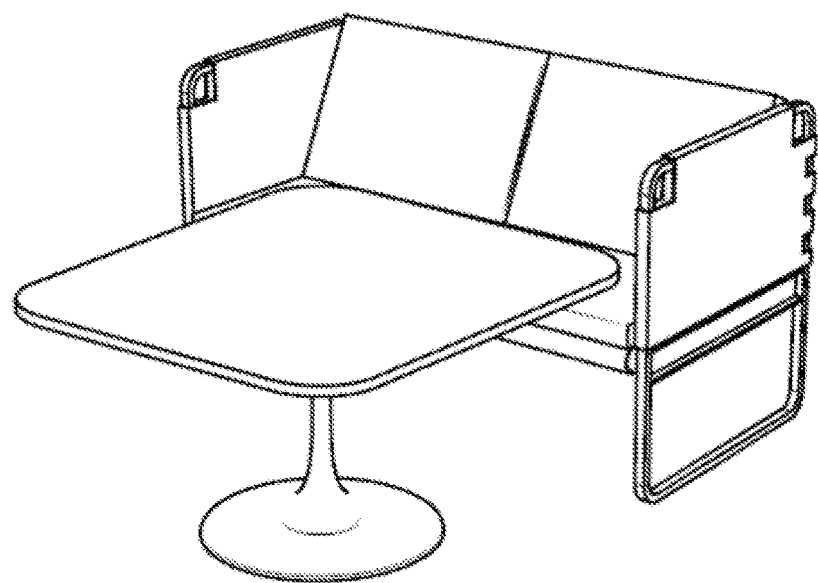

Following FIGS. 8c and 8d, the method 100 continues by performing one or more of the steps as has been described in this disclosure, e.g. with reference to FIGS. 3 to 6, with the difference that the user will be provided with feedback of the currently fitting 3D object models according to the 3D object models that have been merged into the virtual bounding volume.

Feedback of the currently fitting 3D object models may be provided whenever any change occurs in the virtual view. More specifically, feedback of the currently fitting 3D object models may be provided whenever any change occurs to the bounding volumes for the plurality 3D models, or the merged virtual bounding volume. Such a change may be a manipulation which has been described throughout this disclosure. The change may alternatively be any other type of change being related to the real-world environment that affects the virtual bounding volume. For instance, feedback of the currently fitting 3D object models may be received whenever portions of the virtual bounding volume are removed. As seen in FIG. 3 and explained with the embodiments associated therewith, this may occur when the virtual bounding volume is dragged and dropped at a location that is currently occupied by a real-world object, such as a table. As seen in FIG. 4 and explained with the embodiments associated therewith, this may occur when the virtual bounding volume is resized such that it intersects with a real-world object, such as a table. As seen in FIG. 5 and explained with the embodiments associated therewith, this may occur when the user decides to shape the virtual bounding volume to extend under or over an adjacent real-world object, such as a table. Alternatively, feedback may be provided upon additional user input for user manipulation of at least a portion of the virtual bounding volume is received.

As seen in FIGS. 8c-d, in this embodiment the method 100 further comprises displaying 137, in the virtual bounding volume, indications of which 3D object models that have been merged into the virtual bounding volume. The indications may be given in different forms depending on what 3D object models that have been merged. For instance, the indications may be semi-transparent contours of the 3D object models such that contours of each one of the 3D object models are visualized. Alternatively, the indications may be an outer contour that, in each direction in space, indicates which one of the available 3D object models that extends the furthest in said direction. As such, a maximized "blob" can be created, which visualizes the biggest possible 3D object model in each direction. A variety of different indications may be realized, none of which are to be seen as limiting for the displaying 137.

In one embodiment, the method 100 further comprises receiving 138 user input being indicative of one or more viewing options. The viewing options are related to how the user wishes to view the 3D object models represented by the bounding volumes that have been merged into the virtual bounding volume. The viewing options may, for instance, involve transparencies, contours, shadings, colors, other visual effects, and so forth, for each one of the 3D object models.

Upon finished manipulation of the virtual bounding volume, the total number of 3D object models that remains as a fit in the virtual bounding volume is generally less than prior to the manipulation. In FIG. 8d, there is just one 3D object model left that fits the virtual bounding volume. Accordingly, the method 100 further comprises a step of displaying, in the virtual view, at least one 3D object model that fits the virtual bounding volume in the virtual view. This may be performed similar to the displaying step 180 in FIG. 1.

In FIGS. 9a-b, 10a-c, 11a-c and 12a-c, examples of merging bounding volumes are illustrated. For purposes related to simplicity of visualization, the bounding volumes have been depicted as ellipsoids being differently dimensioned. However, the ellipsoids can be interpreted as representing different 3D object models that are to be merged into a virtual bounding volume, much like FIGS. 8a-d. In each one of the examples, three different bounding volumes are merged.

Figure 9A:
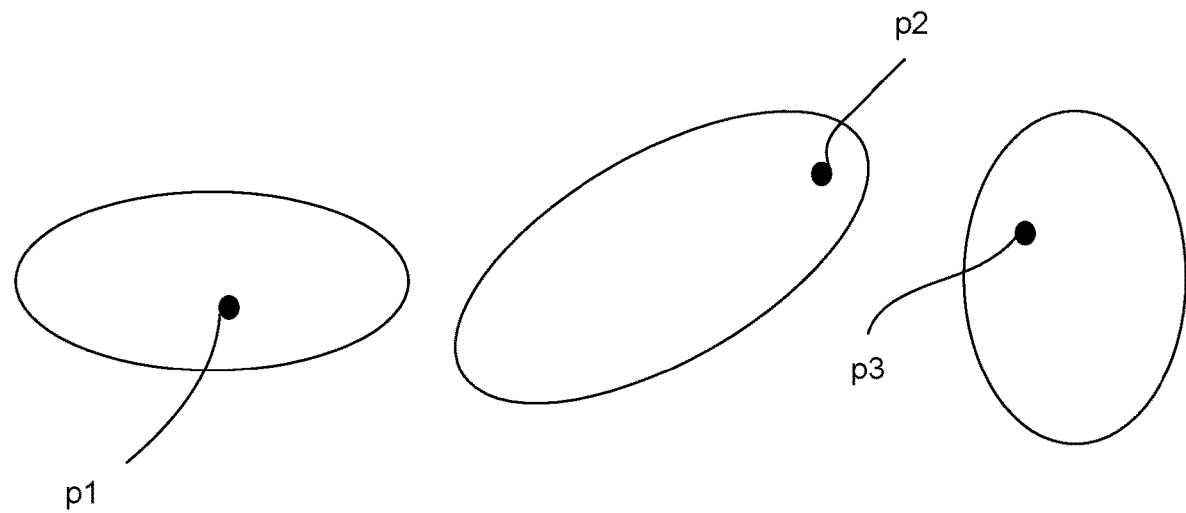
FIG. 9a illustrates another embodiment of merging of bounding volumes.
Figure 9B:
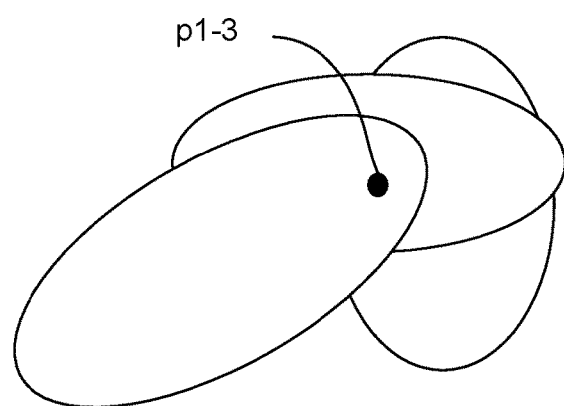

In FIGS. 9a-b, three arbitrary 3D points, p1, p2 and p3, serve as the points wherein the merging is occurring. Accordingly, the bounding volumes are aligned in the virtual bounding volume with respect to each other in the coinciding point p1-3. In this example, the points p1, p2 and p3 have been chosen at a completely random basis.

Figure 10A:
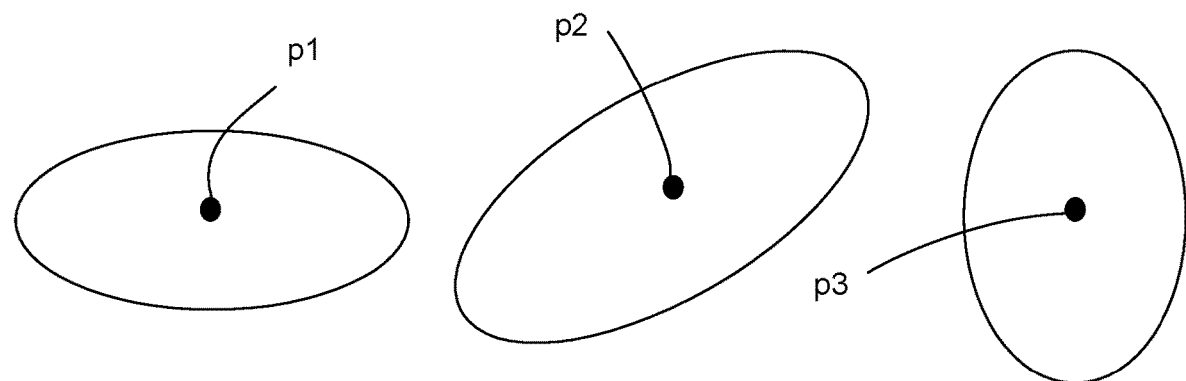
FIG. 10a illustrates another embodiment of merging of bounding volumes.
Figures 10B, 10C:
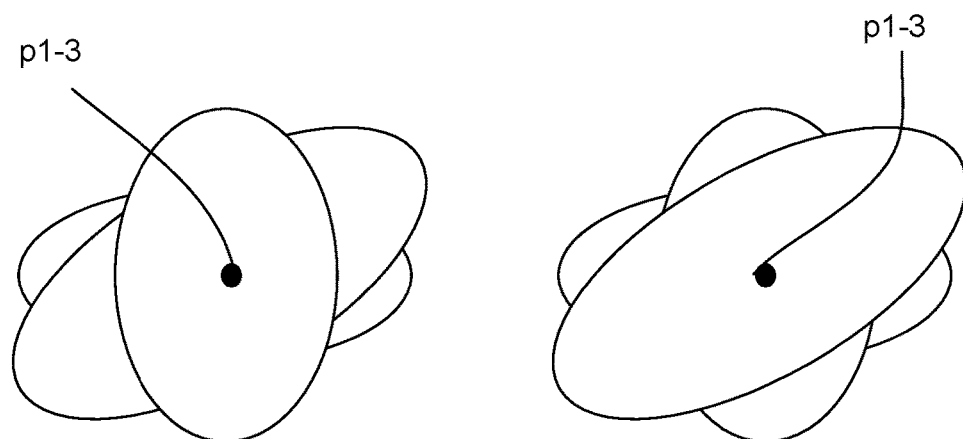

In the embodiment shown in FIGS. 10a-c, the particular 3D points p1, p2 and p3 are located at the same relative positions within the bounding volumes. In this example, each one of the points p1, p2 and p3 are visualized as being centroid points within the ellipsoids.

Accordingly, the coinciding point p1-3 in the virtual bounding volume is a common centroid point for all three bounding volumes being merged into the virtual bounding volume. The coinciding point p1-3 can thus be interpreted as having the coordinates $$coord(p_{x,y,z}) = \left(\frac{x_1 + x_2}{2}, \frac{y_1 + y_2}{2}, \frac{z_1 + z_2}{2}\right)$$

wherein x, y and z are coordinates in 3D space of the virtual bounding volume. FIGS. 10b and 10c show the merging with respect to exactly the same points, but the visualization differs in that different bounding volumes have been placed in the foreground and the background of the virtual view, respectively.

Figure 11A:
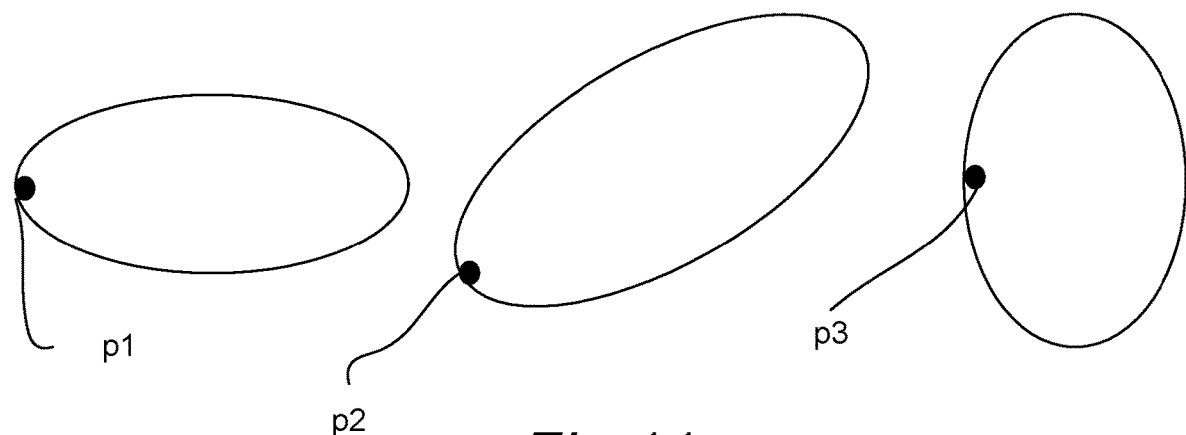
FIG. 11a illustrates another embodiment of merging of bounding volumes.
Figure 11B:
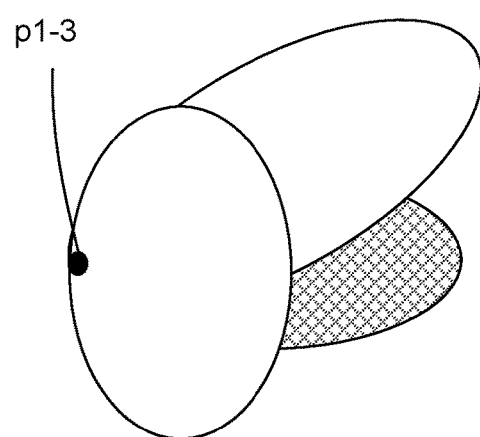
Figure 11C:
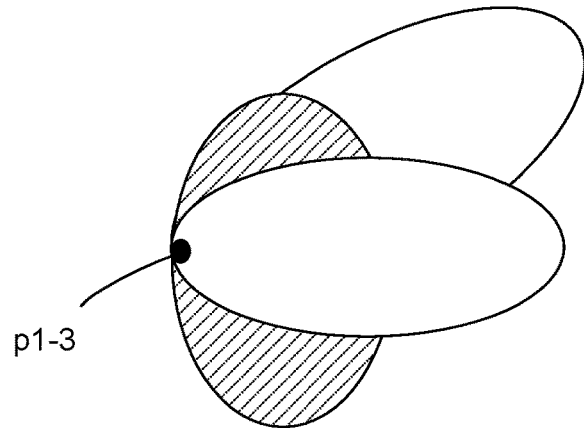

In the embodiment shown in FIGS. 11a-c, the particular 3D points p1, p2 and p3 are located at the same relative positions within the bounding volumes. In this example, each one of the points p1, p2 and p3 are visualized as being leftmost points within each bounding volume. FIGS. b-c furthermore illustrates some different viewing options of the bounding volumes that have been merged into the virtual bounding volume. For instance, the patterns may represent different highlighting, shadings, coloring, visual effects, and so forth.

Figure 12A:
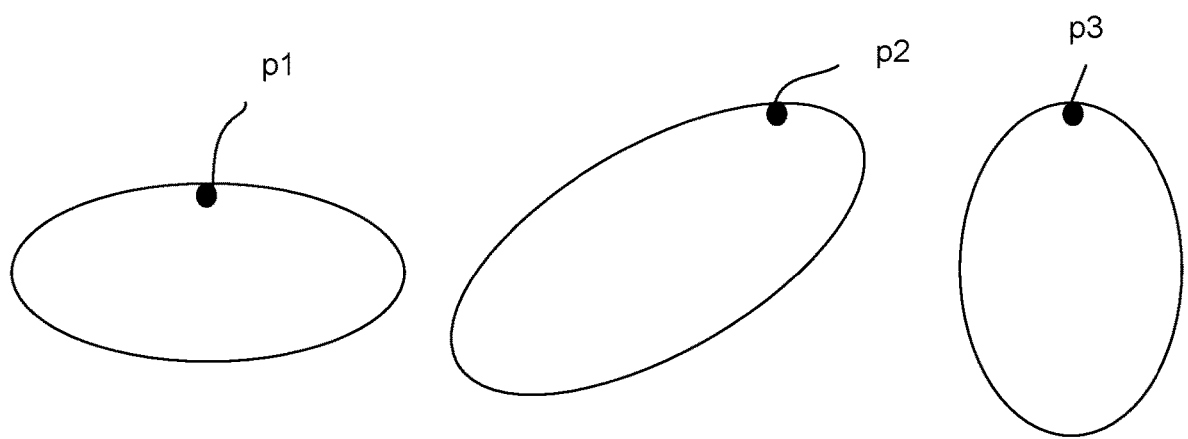
FIG. 12a illustrates another embodiment of merging of bounding volumes.
Figures 12B, 12C:
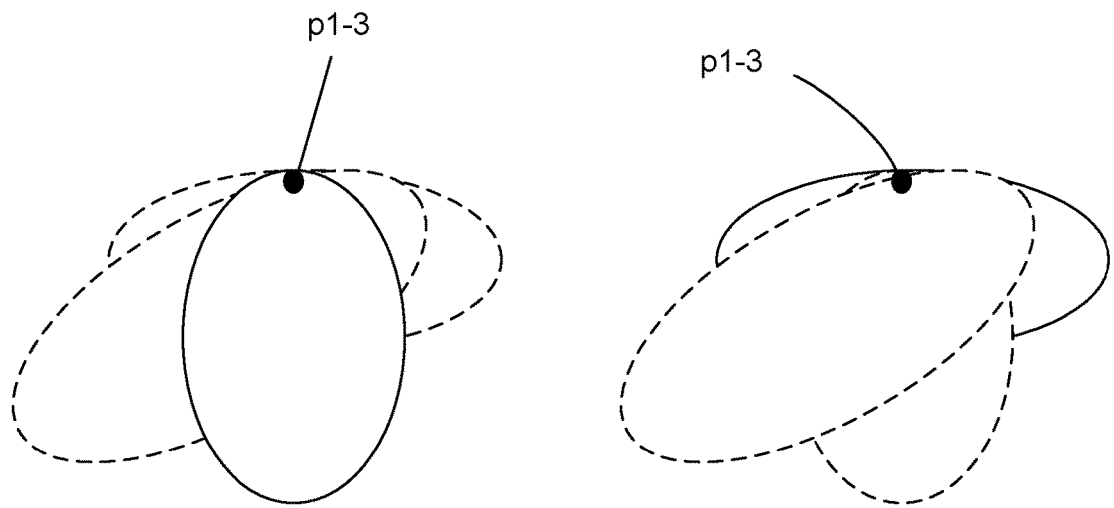

In the embodiment shown in FIGS. 12a-c, the particular 3D points p1, p2 and p3 are located at the same relative positions within the bounding volumes. In this example, each one of the points p1, p2 and p3 are visualized as being top centre points within each bounding volume. FIGS. 12b-c furthermore illustrates some different viewing options of the bounding volumes that have been merged into the virtual bounding volume. For instance, the viewing options may involve showing or not showing contours of any one of the bounding volumes.

As has been demonstrated in the merging embodiments, the particular 3D points pn may be arbitrary points within each one of the bounding volumes such that the particular 3D points coincide in the virtual bounding volume. Hence, the particular 3D points may be any one of centroid points, top centre points, bottom centre points, top edge points, bottom edge points. Alternatively, the particular 3D points may be any point therebetween.

Figure 13:
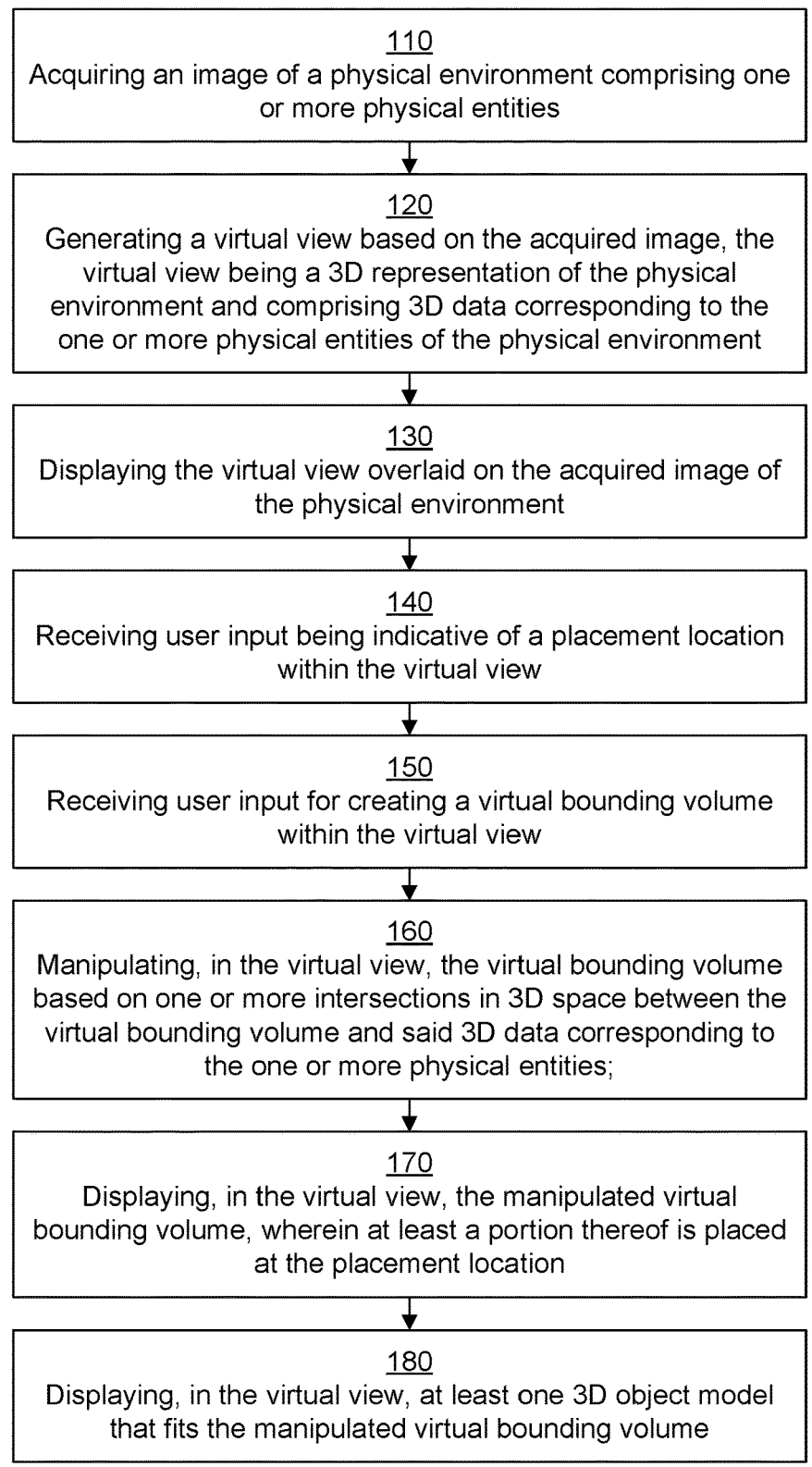
FIG. 13 is a block diagram of a computerized method according to one embodiment.

FIG. 13 illustrates a computerized method 400. The steps 110; 120; 130; 140; 150; 160; 170; 180 are to be performed generally according to the present disclosure. The computerized method 400 may be implemented by a mobile computing device, such as the mobile computing device 10 presented herein.

A computer program product comprising computer code for performing the computerized method 400 according to FIG. 13 when the computer program code is executed by a processing device may be provided. The processing device may, for instance, be a CPU in the mobile computing unit 10 or any external CPU capable of performing the disclosed method steps 110; 120; 130; 140; 150; 160; 170; 180. An example of a computer program product is a non-transitory computer program product, such as a non-transitory computer readable medium.

Further alternative aspects of the present disclosure are described in the following numbered clauses.

Clause 1: A computerized method, comprising: acquiring an image of a physical environment comprising one or more physical entities; generating a virtual view based on the acquired image, the virtual view being a 3D representation of the physical environment and comprising 3D data corresponding to the one or more physical entities of the physical environment; displaying the virtual view overlaid on the acquired image of the physical environment; obtaining bounding volumes for a plurality of 3D object models; merging said bounding volumes for the plurality of 3D object models into a virtual bounding volume, said merging occurring with respect to a particular 3D point within each one of the bounding volumes such that the particular 3D points coincide in the virtual bounding volume; and displaying the virtual bounding volume in the virtual view.

Clause 2: The computerized method according to clause 1, wherein the particular 3D points are located at the same relative positions within the bounding volumes of the plurality of 3D object models.

Clause 3: The computerized method according to clause 2, the particular 3D points being any one of centroid points, top centre points, bottom centre points, top edge points, or bottom edge points, Clause 4: The computerized method according to any of the clauses 1 to 3, wherein said obtaining comprises retrieving the 3D object models from a database unit based on object model filtering input.

Clause 5: The computerized method according to clause 4, the object model filtering input being one or more of product types; product categories; product appearances; product collections; and promotional offers;

Clause 6: The computerized method according to clause 5, wherein the method further comprises displaying, in the virtual bounding volume, indications of the 3D object models of the bounding volumes which have been merged into the virtual bounding volume.

Clause 7: The computerized method according to clause 6, wherein the method further comprises receiving user input being indicative of one or more viewing options for 3D object models of the bounding volumes that have been merged into the virtual bounding volume.

Clause 8: The computerized method according to any of the clauses 1 to 7, wherein the virtual bounding volume comprises a voxel-based data representation.

Clause 9: The computerized method according to any of the clauses 1 to 8, wherein the method further comprises: manipulating, in the virtual view, the virtual bounding volume based on one or more intersections in 3D space between the virtual bounding volume and said 3D data corresponding to the one or more physical entities; displaying, in the virtual view, the manipulated virtual bounding volume, wherein at least a portion of the manipulated virtual bounding volume is placed at a placement location within the virtual view; and displaying, in the virtual view, at least one 3D object model among the plurality of 3D object models that fits the manipulated virtual bounding volume.

Clause 10: The computerized method according to clause 9, wherein said manipulating the virtual bounding volume comprises at least one of removing at least a portion from the virtual bounding volume, and adding at least a portion to the virtual bounding volume.

Clause 11: The computerized method according to clause 9 or 10, wherein before or after said manipulating the virtual bounding volume, the method further comprises receiving additional user input for user manipulation of at least a portion of the virtual bounding volume.

Clause 12: The computerized method according to any one of the clauses 9 to 11, wherein the manipulated bounding volume is dynamically used as search input in response to being manipulated, wherein at least one currently fitting 3D object model among the obtained plurality of 3D object models is retrieved.

Clause 13: The computerized method according to any one of the clauses 9 to 12, further comprising: determining a recommended 3D object model among the obtained plurality of 3D object models, wherein the step of displaying, in the virtual view, at least one 3D object model that fits the manipulated virtual bounding volume comprises displaying the recommended 3D object model.

Clause 14: A mobile computing device being configured to: acquire an image of a physical environment comprising one or more physical entities; generate a virtual view based on the acquired image, the virtual view being a 3D representation of the physical environment and comprising 3D data corresponding to the one or more physical entities of the physical environment; display the virtual view overlaid on the acquired image of the physical environment; obtain bounding volumes for a plurality of 3D object models; merge said bounding volumes for the plurality of 3D object models into a virtual bounding volume, said merging occurring with respect to a particular 3D point within each one of the merged bounding volumes such that the particular 3D points coincide in the virtual bounding volume; and display the virtual bounding volume in the virtual view.

Clause 15: A computer program product comprising computer code for performing the computerized method according to any one of the clauses 1-13 when the computer program code is executed by a processing device.

The invention has been described above in detail with reference to embodiments thereof. However, as is readily understood by those skilled in the art, other embodiments are equally possible within the scope of the present invention, as defined by the appended claims.

What is claimed is:

1. A computerized method, comprising:
   acquiring an image of a physical environment comprising one or more physical entities;
   generating a virtual view based on the acquired image, the virtual view being a 3D representation of the physical environment and comprising 3D data corresponding to the one or more physical entities of the physical environment;
   displaying the virtual view overlaid on the acquired image of the physical environment;
   receiving user input being indicative of a placement location within the virtual view;
   receiving user input for creating a virtual bounding volume within the virtual view;
   manipulating, in the virtual view, the virtual bounding volume based on one or more intersections in 3D space between the virtual bounding volume and said 3D data corresponding to the one or more physical entities, wherein said manipulating comprises at least one of removing at least a portion from the virtual bounding volume and/or adding at least a portion to the virtual bounding volume;
   displaying, in the virtual view, the manipulated virtual bounding volume, wherein at least a portion thereof is placed at the placement location; and
   displaying, in the virtual view, at least one 3D object model that fits the manipulated virtual bounding volume.

2. The computerized method according to claim 1, wherein the one or more intersections in 3D space are caused by one or more of:
   a drag and drop functionality of the virtual bounding volume; and
   a resizing functionality of the virtual bounding volume.

3. The computerized method according to claim 1, wherein before or after said manipulating the virtual bounding volume, the method further comprises receiving additional user input for user manipulation of at least a portion of the virtual bounding volume.

4. The computerized method according to claim 1, wherein a model set comprising at least one 3D object model is retrieved from a database unit using the manipulated virtual bounding volume as search input.

5. The computerized method according to claim 4, wherein the manipulated bounding volume is dynamically used as search input in response to being manipulated, wherein at least one currently fitting 3D object model is retrieved from the database unit.

6. The computerized method according to claim 4, further comprising
   determining a recommended 3D object model among the at least one 3D object model in the model set,
   wherein the step of displaying, in the virtual view, at least one 3D object model that fits the manipulated virtual bounding volume comprises displaying the recommended 3D object model.

7. The computerized method according to claim 4, further comprising a step of receiving user input being indicative of whether the model set is to further be based on a type of
   the physical environment; and/or
   a physical entity of the one or more physical entities.

8. The computerized method according to claim 1, wherein said generating of the virtual view based on the acquired image comprises identifying said one or more physical entities in the physical environment, and tagging the corresponding 3D data as one of a wall, floor, ceiling, or object, wherein the placement location is associated with a tagged 3D data corresponding to one of said one or more physical entities.

9. The computerized method according to claim 8, wherein the step of manipulating the virtual bounding volume comprises one or more from the list of:
   removing portions of the virtual bounding volume located within a 3D intersection between the virtual bounding volume and 3D data tagged as an object;
   removing portions of the virtual bounding volume located within a 3D intersection between the virtual bounding volume and 3D data tagged as a floor, or located vertically below 3D data tagged as a floor;
   removing portions of the virtual bounding volume located within a 3D intersection between the virtual bounding volume and 3D data tagged as a ceiling, or located vertically above 3D data tagged as a ceiling; and
   removing portions of the virtual bounding volume located within a 3D intersection between the virtual bounding volume and 3D data tagged as a wall, or located horizontally outside 3D data tagged as a wall.

10. The computerized method according to claim 8, wherein said generating of the virtual view comprises segmenting 3D data tagged as an object into one or more separate objects, and tagging the 3D data correspondingly,
    wherein the placement location is associated with 3D data tagged as a specific object of the one or more separate objects, wherein the step of manipulating the virtual bounding volume comprises:
    removing portions of the virtual bounding volume located within a 3D intersection between the virtual bounding volume and 3D data tagged as the specific object, or located vertically below 3D data tagged as the specific object.

11. The computerized method according to claim 10, wherein after the virtual bounding volume is created, the method further comprising a step of receiving user input for changing the 3D data associated with the placement location.

12. The computerized method according to claim 8, wherein the placement location is associated with 3D data tagged as a floor, wherein the step of manipulating the virtual bounding volume comprises:
    removing portions of the virtual bounding volume located within a 3D intersection between the virtual bounding volume and 3D data tagged as an object, and portions located vertically above 3D data tagged as an object.

13. A mobile computing device being configured to:
    acquire an image of a physical environment comprising one or more physical entities;
    generate a virtual view based on the acquired image, the virtual view being a 3D representation of the physical environment and comprising 3D data corresponding to the one or more physical entities of the physical environment;
    display the virtual view overlaid on the acquired image of the physical environment;
    receive user input being indicative of a placement location within the virtual view;
    receive user input for creating a virtual bounding volume within the virtual view;

manipulate, in the virtual view, the virtual bounding volume based on one or more intersections in 3D space between the virtual bounding volume and said 3D data corresponding to the one or more physical entities, wherein said manipulating comprises at least one of removing at least a portion from the virtual bounding volume and/or adding at least a portion to the virtual bounding volume;

display, in the virtual view, the manipulated virtual bounding volume, wherein at least a portion thereof is placed at the placement location; and display, in the virtual view, at least one 3D object model that fits the manipulated virtual bounding volume.

14. A non-transitory computer readable medium comprising computer code, which when executed by a processing device of a computer, causes the computer to:

acquire an image of a physical environment comprising one or more physical entities;

generate a virtual view based on the acquired image, the virtual view being a 3D representation of the physical environment and comprising 3D data corresponding to the one or more physical entities of the physical environment;

display the virtual view overlaid on the acquired image of the physical environment;

receive user input being indicative of a placement location within the virtual view;

receive user input for creating a virtual bounding volume within the virtual view;

manipulate, in the virtual view, the virtual bounding volume based on one or more intersections in 3D space between the virtual bounding volume and said 3D data corresponding to the one or more physical entities, wherein said manipulating comprises at least one of removing at least a portion from the virtual bounding volume and/or adding at least a portion to the virtual bounding volume;

display, in the virtual view, the manipulated virtual bounding volume, wherein at least a portion thereof is placed at the placement location; and display, in the virtual view, at least one 3D object model that fits the manipulated virtual bounding volume.

* * * * *